(12) United States Patent
Kudoh

(10) Patent No.: US 7,990,444 B2
(45) Date of Patent: Aug. 2, 2011

(54) SOLID-STATE IMAGING DEVICE AND CAMERA

(75) Inventor: Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 360 days.

(21) Appl. No.: 12/358,086

(22) Filed: Jan. 22, 2009

(65) Prior Publication Data

US 2009/0213256 A1 Aug. 27, 2009

(30) Foreign Application Priority Data

Feb. 26, 2008 (JP) ................................. 2008-045213

(51) Int. Cl.
*H04N 5/335* (2006.01)
*H04N 9/083* (2006.01)
(52) U.S. Cl. ......................... 348/276; 348/290; 257/294
(58) Field of Classification Search .................. 348/276, 348/277, 290
See application file for complete search history.

(56) References Cited

U.S. PATENT DOCUMENTS

| | | | | |
|---|---|---|---|---|
| 5,499,111 | A * | 3/1996 | Sato et al. ..................... | 382/252 |
| 6,278,490 | B1 * | 8/2001 | Fukuda et al. ................ | 348/362 |
| 2008/0068477 | A1 * | 3/2008 | Iida et al. ..................... | 348/294 |
| 2008/0079807 | A1 * | 4/2008 | Inuiya et al. .................. | 348/70 |
| 2009/0215220 | A1 * | 8/2009 | Toda .............................. | 438/87 |
| 2010/0157091 | A1 * | 6/2010 | Honda et al. ............ | 348/E9.051 |

FOREIGN PATENT DOCUMENTS

| | | |
|---|---|---|
| JP | 2002-135792 | 5/2002 |
| JP | 2003-199117 | 7/2003 |
| JP | 2003-318375 | 11/2003 |
| JP | 2007-53731 | 3/2007 |

* cited by examiner

*Primary Examiner* — Hung H Lam
(74) *Attorney, Agent, or Firm* — Robert J. Depke; Rockey, Depke & Lyons, LLC

(57) ABSTRACT

Disclosed is a solid-state imaging device which includes a group of elements, the group including at least color photoelectric conversion elements configured to convert light signals in first, second, and third wavelength ranges to electric signals, respectively, a white photoelectric conversion element configured to convert light signals in the wavelength range including the entire visible light range and a portion of the infrared light range to electric signals, and a light-shielded diode element configured to be shielded from light. A unit is formed by including the white photoelectric conversion element and the light-shielded diode element for one color photoelectric conversion element, and within the unit, the white photoelectric conversion element is electrically connected with the light-shielded diode element by way of an overflow path. A camera provided with the solid-state imaging device is also disclosed.

20 Claims, 16 Drawing Sheets

A-SECTION

B-SECTION

C-SECTION

D-SECTION

E-SECTION

F-SECTION

SOLID-STATE IMAGING DEVICE AND CAMERA

CROSS REFERENCES TO RELATED APPLICATIONS

The present invention contains subject matter related to Japanese Patent Application JP 2008-045213 filed in the Japanese Patent Office on Feb. 26, 2008, the entire contents of which being incorporated herein by reference.

BACKGROUND OF THE INVENTION

1. Field of the Invention

The invention generally relates to solid-state imaging devices and cameras. More particularly, the invention relates to a solid-state imaging device and a camera provided with the solid-state imaging device.

2. Description of the Related Art

Solid-state imaging devices are classified broadly into amplification type solid-state imaging devices, which are typically illustrated by CMOS (complementary metal-oxide semiconductor) image sensors, and charge transfer type imaging devices, which are typified by CCD (charge-coupled device) image sensors.

As to CMOS image sensors, the trend of replacement has been in progress at rapid speed particularly in the area of portable device-oriented image sensors from typical CCD sensors to the CMOS image sensors owning to high performance and low power consumption characteristics of the latter sensors. The CMOS image sensor is provided by including an imaging section having a plurality of pixels regularly arranged in a two-dimensional array, each of the pixels including a photodiode (PD) serving as a photoelectric conversion element and several pixel transistors; and peripheral circuits disposed around the imaging section.

The peripheral circuits include at least column circuits (so-called vertical driving units) for transmitting signals in the column direction, and horizontal circuits (so-called horizontal driving units) for sequentially transferring the signals, which are transmitted column wise by the column circuits, to an output circuit. The pixel transistors have a known configuration such as, for example, four-transistor circuit configuration including transfer, reset, amplifying, and selection transistors; or three-transistor circuit configuration including the transfer, reset, and amplifying transistors excepting the selection transistor.

The CMOS image sensor is generally provided by arranging a plurality of unit pixels, in which each of the unit pixels includes one photodiode and several pixel transistors, as a set. In recent years the miniaturization of the pixel size has been noticeable. With regard to the CMOS image sensor including a large number of pixels, many CMOS image sensors configured to share pixel transistors with a plurality of pixels in order to reduce the number of pixel transistors per unit pixel are known.

As the method of improving sensitivity while maintaining resolution without reducing the pixel size, the improvement of sensitivity by means of the slant arrangement of pixels is known. In addition, the improvement of luminosity signal sensitivity in the pixel is also known, which is carried out by employing a white pixel or alternatively a gray pixel (refer to Japanese Unexamined Patent Application Publication No. 2003-199117, Japanese Unexamined Patent Application Publication No. 2003-318375, Japanese Unexamined Patent Application Publication No. 2007-53731, and Japanese Unexamined Patent Application Publication No. 2002-135792). FIG. 1 schematically illustrates an image sensor including a white pixel, disclosed in Patent document 4. In this image sensor 102, as shown in FIG. 1, one unit is formed by including two pixels each vertically and horizontally, four pixels in total, a red pixel 101R, a green pixel 101G, a blue pixel 101B, and a white pixel 101W are disposed in the unit to form a pixel unit, and a number of the thus formed pixel unit structures are arranged two-dimensionally. Incidentally, it is noted on the slant arrangement of pixels that the vertical and horizontal resolutions can be retained, however the resolution in a slanting direction is decreased.

SUMMARY OF THE INVENTION

In the solid-state imaging device, the reduction of a pixel size may cause the degradation of pixel characteristics. For example, the reduction of a pixel area leads directly to the decrease in the number of incident photons. That is, the output per a pixel decreases and the signal-to-noise ratio deteriorates. On the other hand, the miniaturization of image sensor modules is among pressing demands, and the demand for increasing the number of pixels has not on the decline at present. Regarding the degradation of pixel characteristics caused by the reduced pixel size, the characteristics of a unit pixel have been improving with the improvement of fabrication processes and pixel structures, and the finish of picture images is also improving with the progress in image-processing technology. However, in regard to purely optical characteristics such as the abovementioned sensitivity, the trend of degradation including color mixing is proceeding at an accelerating pace with an additional difficulty in proper light condensation.

On the other hand, one of the problems has been realized with the image sensor 102 using the white pixel in that the photodiode serving as a photoelectric conversion element for a white pixel 101W is saturated more rapidly compared with the photodiodes for color pixels 101R, 101G, and 101B of different colors, red (R), green (G), and blue (B), respectively, which are all disposed in the same imaging section. For an image sensor having a relatively low working voltage such as the CMOS image sensor, the depletion potential of the photodiode is relatively shallow and the amount of charge accumulation is not sufficiently large. As a result, as shown schematically in FIG. 2, in the previous image sensor 102 provided with the red pixel 101R, green pixel 101G, blue pixel 101B, and white pixel 101W, it is not capable of taking suitable measures to deal with the overflow caused in the photodiodes in the case of the incidence of high intensity light L, and it follows that the charges 3 leak out of the pixel previously saturated (white pixel 101 W in the drawing) into neighboring pixels (red pixels 101R and blue pixels 101B), that is, the color mixing takes place. Therefore, even if the luminosity signal sensitivity of the white pixel is increased, the amount of light can only be handled at most to the extent not to saturate the white pixel photodiode. In such a circumstance, the output signal level of other color pixels such as red, green, and blue color pixels, each can yield only approximately one-half of the nominal output range of photodiode.

In view of the abovementioned and other difficulties, it is desirable to provide a solid-state imaging device capable of properly dealing with the strong incident light and improving the output range for each color pixel, while seeking to improve sensitivity by including a white pixel, and to provide a camera provided with the solid-state imaging device.

A solid-state imaging device according to an embodiment of the present invention includes an imaging section including a group of elements and a peripheral circuit disposed around the imaging section. The group of elements includes color photoelectric conversion elements configured to convert light signals in first, second, and third wavelength ranges to electric signals, respectively, a white photoelectric conversion element configured to convert light signals in a wavelength range including an entire visible light range and a portion of an infrared light range to electric signals, and a light-shielded diode element configured to be shielded from light. In the imaging section, a unit is formed by including a white photoelectric conversion element and a light-shielded diode element for one color photoelectric conversion element, and within the unit, the white photoelectric conversion element is electrically connected with the light-shielded diode element by way of an overflow path.

A camera according to an embodiment of the invention includes a solid-state imaging device, an optical system configured to lead incident light to a photoelectric conversion element included in the solid-state imaging device, and a signal processing circuit configured to process output signals from the solid-state imaging device. The solid-state imaging device includes a group of elements, the group of elements including color photoelectric conversion elements configured to convert light signals in first, second, and third wavelength ranges to electric signals, respectively, a white photoelectric conversion element configured to convert light signals in a wavelength range including an entire visible light range and a portion of an infrared light range to electric signals, and a light-shielded diode element configured to be shielded from light. A unit is formed by including a white photoelectric conversion element and a light-shielded diode element for one color photoelectric conversion element, and within the unit, the white photoelectric conversion element is electrically connected with the light-shielded diode element by way of an overflow path.

The solid-state imaging device according to an embodiment of the invention includes at least the white photoelectric conversion element and the light-shielded diode element, and both of the elements are connected with each other by way of an overflow path. With the present structure of the solid-state imaging device, upon the incidence of high intensity light to the white photoelectric conversion element, the charges overflowed from the white photoelectric conversion element enter into and are accumulated in the light-shielded diode element. As a result, the saturation charges of the white photoelectric conversion element amount to the sum of the amount accumulated in the white photoelectric conversion element and the light-shielded diode element. On the other hand, in each of the color photoelectric conversion elements, the charges can properly be accumulated so as to yield the nominal output level of signals for the photoelectric conversion elements.

With the solid-state imaging device according to an embodiment of the present invention, the luminosity signal sensitivity can be improved by increasing the amount of saturation charges of the white photoelectric conversion element. In addition, the output signal range is improved for each of the color photoelectric conversion elements. With the camera according to an embodiment of the present invention, high sensitivity and high power picture images can be obtained by incorporating the solid-state imaging device mentioned as above.

BRIEF DESCRIPTION OF THE DRAWINGS

The preferred embodiments of the invention will be described in detail with reference to the following drawings, wherein.

DESCRIPTION OF THE PREFERRED EMBODIMENTS

Figure 1:
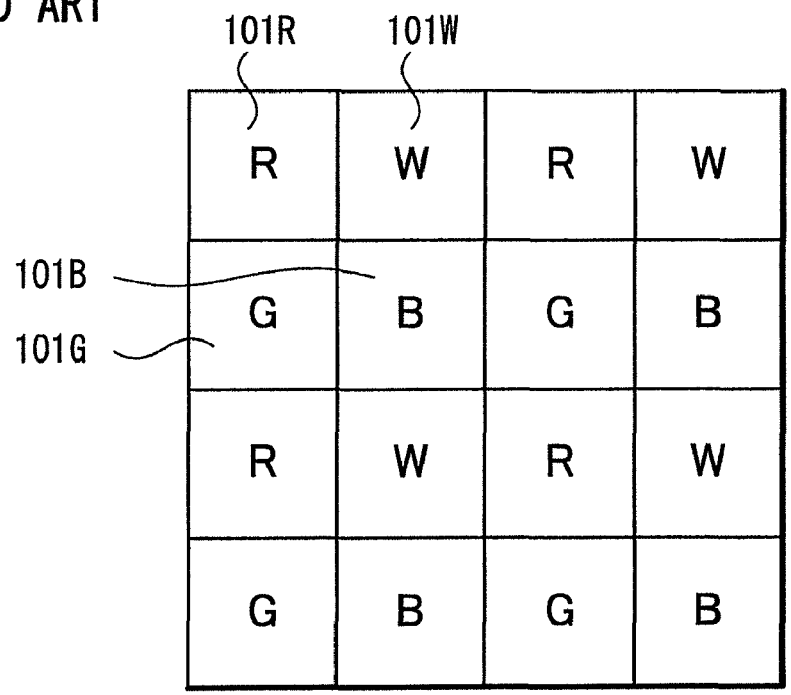
FIG. 1 is a schematic view of a related art pixel structure including a white pixel in the image sensor.
Figure 2:
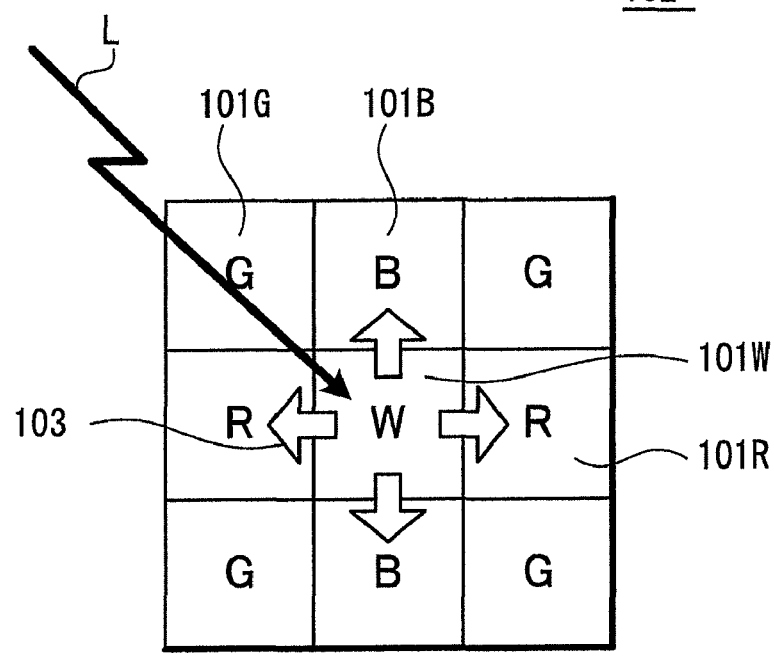
FIG. 2 is a schematic view of the major portion of another related art pixel structure included in the image sensor, prepared for purposes of illustrating the difficulty in the related art.

The present invention will be described hereinbelow on several embodiments by referring to the accompanying drawings. It is not intended to be exhaustive or to limit the invention to those disclosed in the embodiments and illustrated in the drawings.

Figure 3:
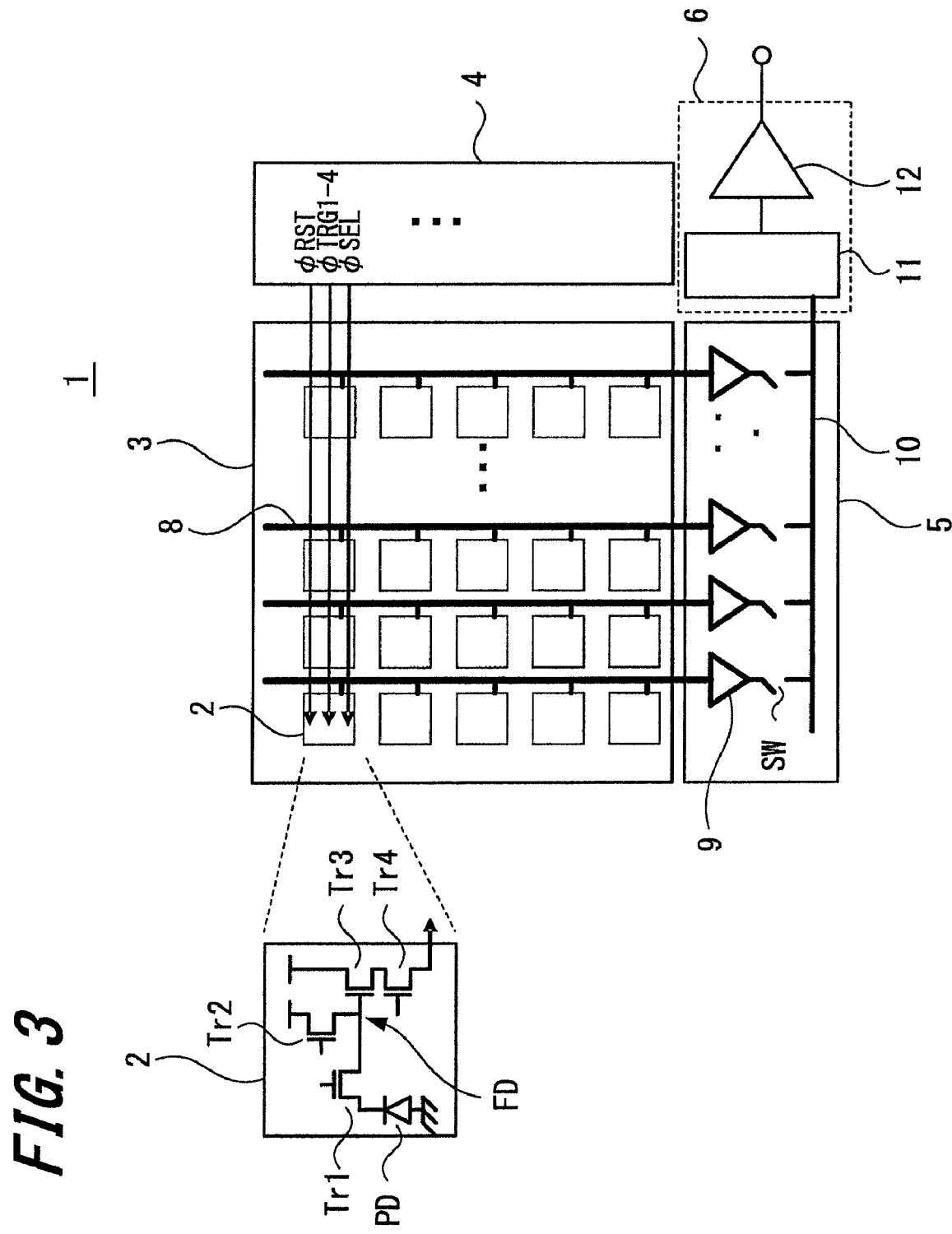
FIG. 3 is a drawing generally illustrating a configuration adapted to a solid-state imaging device according to an embodiment of the present invention.

FIG. 3 is a drawing generally illustrating a device configuration adapted to a solid-state imaging device or CMOS image sensor according to an embodiment of the present invention. Referring to FIG. 3, a solid-state imaging device 1 according to the present embodiment includes an imaging section 3 (so-called pixel section) having a plurality of pixels 2 arranged two-dimensionally with regularity, and peripheral circuits disposed around the imaging section 3, such as a vertical driving unit 4, a horizontal transfer unit 5, and an output unit 6. Each of the pixels 2 is provided by including a photodiode PD serving as a photoelectric conversion element and several pixel transistors (MOS transistors) Tr.

The photodiode PD is formed with a region configured to be subjected to photoelectrical conversion with incident light and to accumulate signal charges generated by the photoelectrical conversion. In the present example, these several pixel transistors Tr include four MOS transistors, such as a transfer transistor Tr1, a reset transistor Tr2, an amplifying transistor Tr3, and a selection transistor Tr4. The transfer transistor Tr1 serves as the transistor for reading out the photoelectric signal charges accumulated in the photodiode PD to a floating diffusion region (FD). The reset transistor Tr2 is the transistor for setting the potential of the floating diffusion (FD) region to a prescribed value. The amplifying transistor Tr3 is for electrically amplifying the signal charges readout to the floating diffusion region (FD). The selection transistor Tr4 is for selecting a pixel line and reading out pixel signals therein to the vertical signal line 8. In addition, although no drawing is provided herein, the pixel may alternatively be formed with the photodiode PD and three transistors including the transfer, reset, and amplifying transistors excepting the selection transistor Tr4.

In the circuit configuration of the pixel 2, the source of the transfer transistor Tr1 is connected with the photodiode PD, and the drain of the transfer transistor Tr1 is connected with the source of the reset transistor Tr2. The floating diffusion region (FD) serving as charge-voltage conversion means, which is disposed between the transfer transistor Tr1 and the reset transistor Tr2 (equivalent to the drain region of the transfer transistor and the source region of the reset transistor), is connected with the gate of the amplifying transistor Tr3. The source of the amplifying transistor Tr3 is connected with the drain of the selection transistor Tr4. The drains of reset transistor Tr2 and amplifying transistor Tr3 are both connected with a source voltage supply unit. In addition, the source of the selection transistor Tr4 is connected with the vertical signal line 8.

The vertical driving unit 4 is configured to respectively supply a line reset signal ΦRST to be applied in common to the gates of the reset transistors Tr2 of the pixels arranged in a line, a line transfer signal ΦTRG to be applied in common to the gates of the transfer transistors Tr1 of the pixels arranged in the line, and a line selection signal ΦSEL to be applied in common to the gates of the selection transistors Tr4 of the pixels arranged in the line.

The horizontal driving unit 5 is provided by including amplifiers or analog-to-digital converters (ADC) connected with the vertical signal line 8 of each column, such as analog-to-digital converters 9 in the present example; line selection circuits (switch means) SW; and a horizontal transfer line 10 (bus consisting of as many lines as data bit lines, for example) The output unit 6 is provided by including another amplifier or analog-to-digital converter and/or signal-processing circuit, such as a signal-processing circuit 11 for processing outputs from the horizontal transfer line 10 and an output buffer 12 in the present example.

The solid-state imaging device 1 is configured for the signals from the pixels 2 on each line to be subjected to analog-to-digital conversion with each analog-to-digital converter 9, readout to the horizontal transfer line 10 by way of the line selection circuits SW which are sequentially selected, and transferred sequentially in the horizontal direction. The image data readout to the horizontal transfer line 10 are subsequently output from the output buffer 12 by way of the signal-processing circuit 11.

The operation in the pixel 2 is carried out in general as follows. First, by bringing the gates of the transfer transistor Tr1 and the reset transistor Tr2 to on-state, the charges in the photodiode PD are all cleared out. Thereafter, the gates of the transfer transistor Tr1 and the reset transistor Tr2 are brought to off-state, and photoelectric charge accumulation is carried out. Next, immediately prior to reading out photoelectric charges accumulated in the photodiode PD, the gate of the reset transistor Tr2 is turned on and the potential of the floating diffusion region (FD) is reset. Subsequently, by changing the gate of the reset transistor Tr2 to off-state and the gate of the transfer transistor Tr1 to on-state, respectively, the photoelectric charges from the photodiode PD are transferred to the floating diffusion region (FD). The amplifying transistor Tr3 is configured to amplify electrically the signal charges upon receiving the charges by the gate thereof. On the other hand, from the moment of abovementioned resetting of the potential of the floating diffusion region immediately before the charge reading, the selection transistor Tr4 is brought to on-state only for the pixel to be presently readout, and it follows that image signals, which have been subjected to charge-to-voltage conversion and provided from the amplifying transistor Tr3 included in the presently addressed pixel, are readout to the horizontal signal line 8.

In addition, according to the present embodiment, in the above-described solid-state imaging device 1, the pixels are configured, while seeking to improve the sensitivity by including a white pixel, so as to be capable of properly dealing with the strong incident light and to improve the output range of each color pixel. That is, although a white pixel is included in the device of the present embodiment, the pixels are configured so that even on receiving high intensity incident light, the color mixing can be prevented, which is caused by the leak of electric charges from the white pixel to neighboring pixels, and moreover an intended output signal range for each color pixel may be obtained without being influenced by the amount of saturation charge of the white pixel. It is noted herein that the abovementioned color pixels are ones each including color photoelectric conversion elements which are configured to convert light signals respectively in first, second, and third wavelength ranges to electric signals. That is, provided as the above-noted color pixels are either the pixels each including a red, green, or blue primary color filter, or ones each including a cyan, magenta, or yellow complementary color filter.

Figure 4:
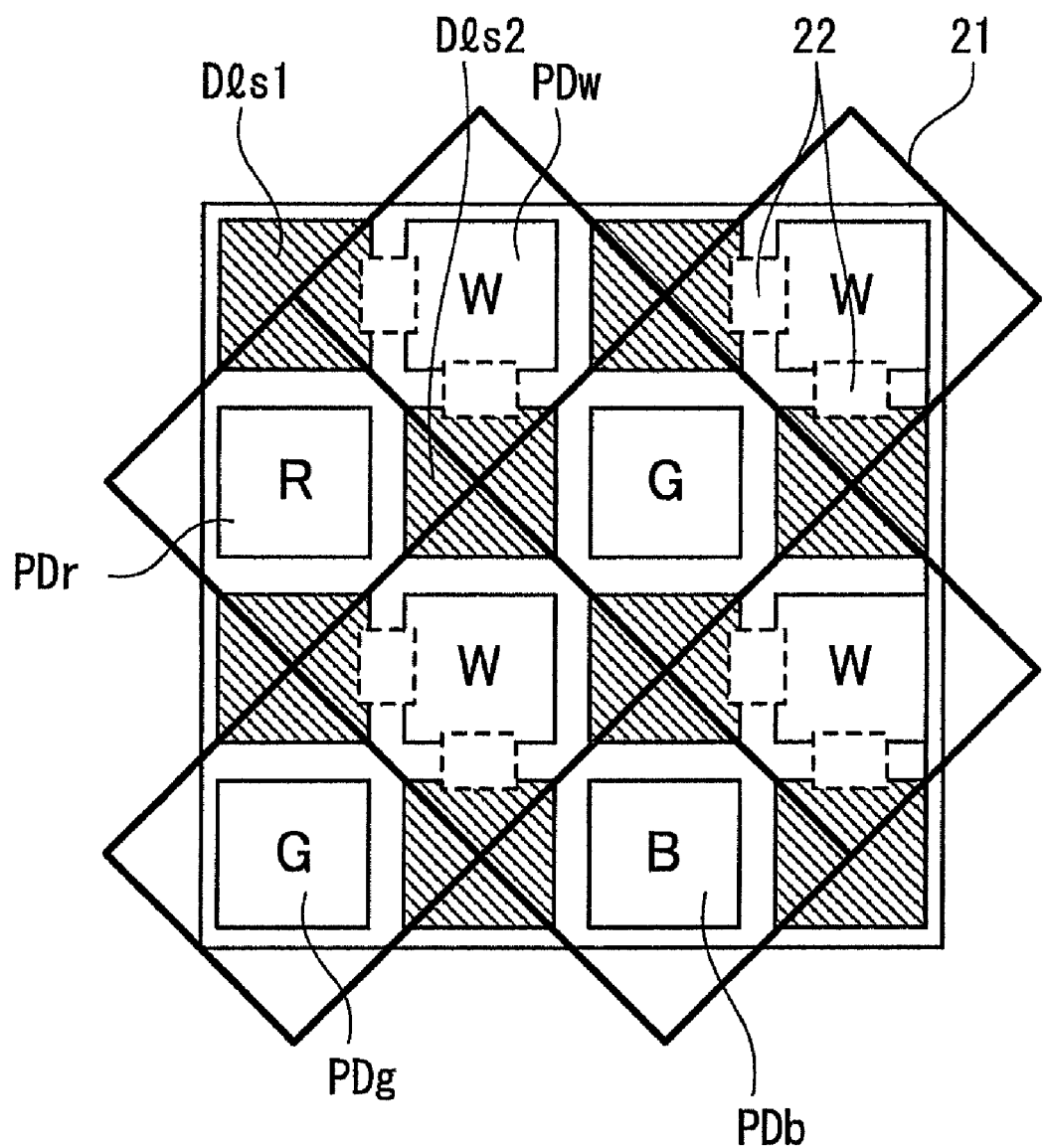
FIG. 4 is a schematic view illustrating the major portion of an imaging section according to a first embodiment of the present invention.

FIG. 4 is a schematic view illustrating the major portion of an imaging section included in the solid-state imaging device, according to a first embodiment of the present invention. This drawing illustrates diagrammatically the configuration of pixels in the imaging section, particularly the arrangement configuration of photodiodes serving as photoelectric conversion elements constituting the pixels. In the present embodiment, the photoelectric conversion elements include a group of photodiodes including color photodiodes PD configured to convert light signals in respective wavelength ranges of as red (R), green (G), and blue (B) to electric signals (hereinafter referred to as a red photodiode PDr, a green photodiode PDg, and a blue photodiode PDb, respectively); another photodiode PD configured to convert to further electric signals from light signals in the wavelength range including the entire visible light range and a portion of the infrared light range (hereinafter referred to as a white photodiode PDw); and still another diode shielded from light (hereinafter referred to as light-shielded diode Dls).

These photodiodes PDr, PDg, PDb, and PDw and the diode Dls are arranged in a square arrangement so as to constitute one unit having two photodiodes each vertically and horizontally, four in total, as detailed herein below. That is, within the unit, two photodiodes PD that are capable of allowing the light incidence are disposed along a first diagonal, and two diodes Dls1 and Dls2 that are shielded by metal wirings are disposed along a second diagonal perpendicular to the first diagonal. One of the abovementioned two photodiodes PD, which are capable of allowing the light incidence, is a photodiode provided with a color filter for one of red (R), green (G), and blue (B), i.e., one of the red photodiode PDr, green photodiode PDg, and blue photodiodes PDb. And, the other of the abovementioned two photodiodes PD is the white photodiode PDw provided with a light transparent filter, not having a color filter for color separation.

The group of the red photodiode PDr, green photodiode PDg, and blue photodiode PDb is disposed in the Bayer arrangement. On-chip lenses 21 for condensing incidence light onto photodiodes PD are disposed only above the red, green, and blue color photodiodes PDr, PDg, and PDb, and the white photodiode PDw, each having openings to the light. Namely, while the photodiodes are in the square arrangement, the on-chip lenses 21 are provided in the slant arrangement. In addition, the color filters each have respective color filter components in red, green, and blue, and a white (transparent) filter component. These color filter components are provided in the slant arrangement and the red, green, and blue color filter components are provided in the Bayer arrangement.

Furthermore, respective photodiodes and diodes (substantially respective pixels) are divided from each other by device isolation regions, while the white photodiode PDw and the two light-shielded diodes Dls1 and Dls2 are interconnected within each of the abovementioned unit by overflow paths 22.

Figure 5A:
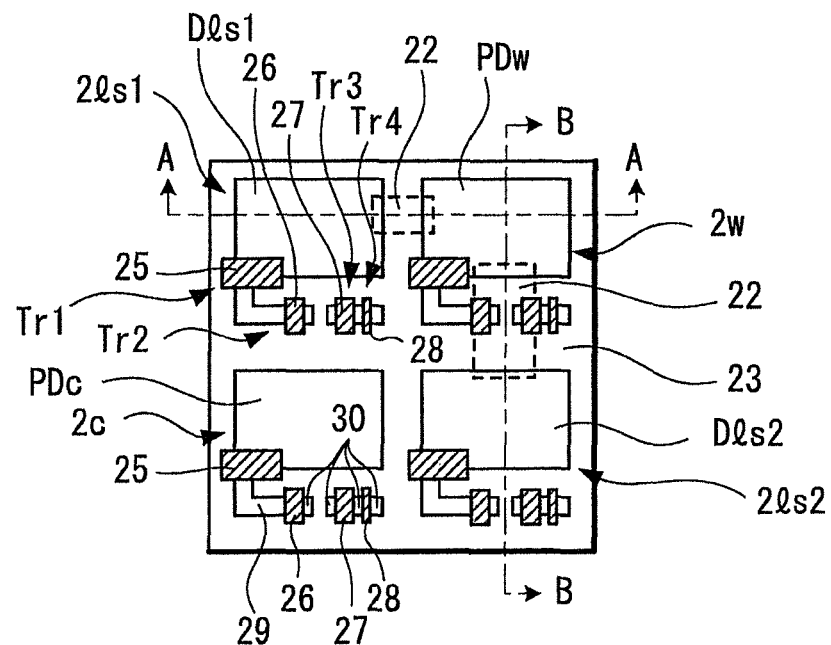
FIG. 5A is a schematic view illustrating the structure of pixels included in one unit adapted to the solid-state imaging device according to the first embodiment of the present invention.
Figure 5B:
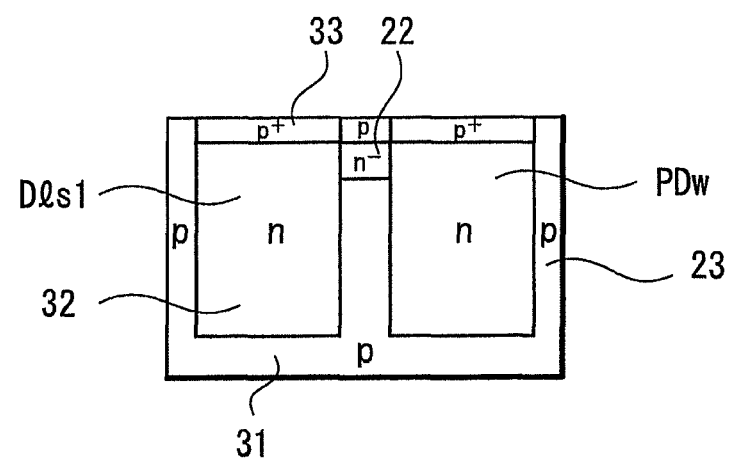
FIG. 5B is a cross-sectional view taken along the line A-A of FIG. 5A.
Figure 5C:
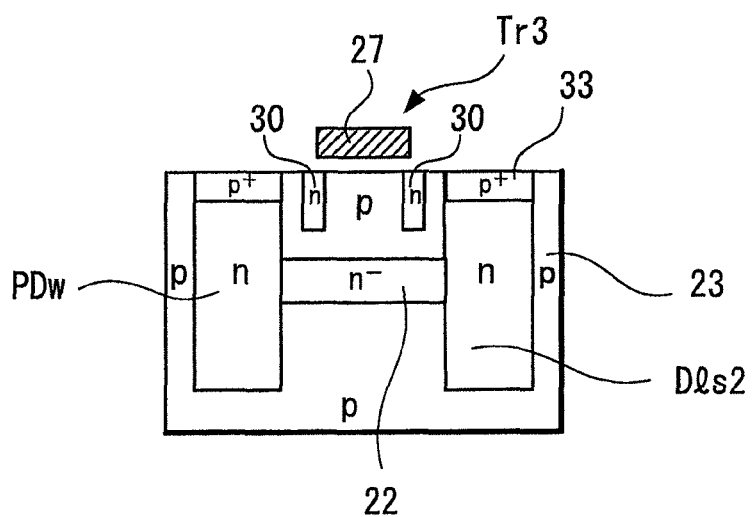
FIG. 5C is a cross-sectional view taken along the line B-B of FIG. 5A.

FIGS. 5A, 5B, and 5C are views schematically illustrating the structure of pixels included in one unit adapted to the solid-state imaging device according to the first embodiment of the present invention. Referring to FIG. 5A, the unit is formed by including two pixels each vertically and horizontally, four pixels in total; and disposing one color pixel 2c out of red, green, and blue (RGB) color pixels, and one white pixel 2w along one diagonal; and two light-shielded pixels 2ls (2ls1 and 2ls2) along the other diagonal. The color pixels 2c, 2w and 2ls are each subjected to device isolation with device isolation regions 23 such as, for example, impurity regions. Each of the pixels 2c, 2w, and 2ls consists of one photodiode out of photodiodes PDc (PDr, PDg, or PDb), PDw, and diode Dls, and of several pixel transistors Tr. Provided as the several pixel transistors Tr in the drawing are a transfer transistor Tr1 having a transfer gate electrode 25, a reset transistor Tr2 having a reset gate electrode 26, an amplifying transistor Tr3 having an amplification gate electrode 27, and a selection transistors Tr4 having a selection gate electrode 28. A region 29 in the drawing is a floating diffusion region (FD), and a region 30 is a source or drain region.

As shown in FIG. 5B (a cross-sectional view taken along a line A-A of FIG. 5A) and FIG. 5C (along a line B-B of FIG. 5A), each of the photodiodes is formed by providing, in a semiconductor well region 31 having a first conductivity type i.e., p-type in the present example, a semiconductor region 32 as a charge accumulation region having a second conductivity type opposite to that of the first conductivity type (i.e., n-type); and by further providing, on the surface side of the semiconductor region 32, a p-type semiconductor region 33 as a charge accumulation layer. The device isolation region 23 is formed with a p-type semiconductor region.

The overflow path 22 for connecting between the white photodiode PDw and the light-shielded diode Dls (Dls1, Dls2) is formed in the device isolation region 23 with p− or n− region, i.e., n− region in this example. The overflow path 22, which is situated under the region where no pixel transistor Tr is formed on the surface side thereof, can be formed in a relatively shallow region as shown in FIG. 5B. By contrast, another overflow path 22, which is situated under the region where the pixel transistor Tr is formed on the surface side thereof, is formed in a relatively deep region from the pixel transistor Tr as shown in FIG. 5C.

The photodiodes PD (PDc, PDw) and diode (Dls) are each formed with semiconductor regions having the same area and the same impurity concentration. That is, the photodiodes PD and diode (Dls) can be formed to have the same amount of saturation electric charges.

Figure 8A:
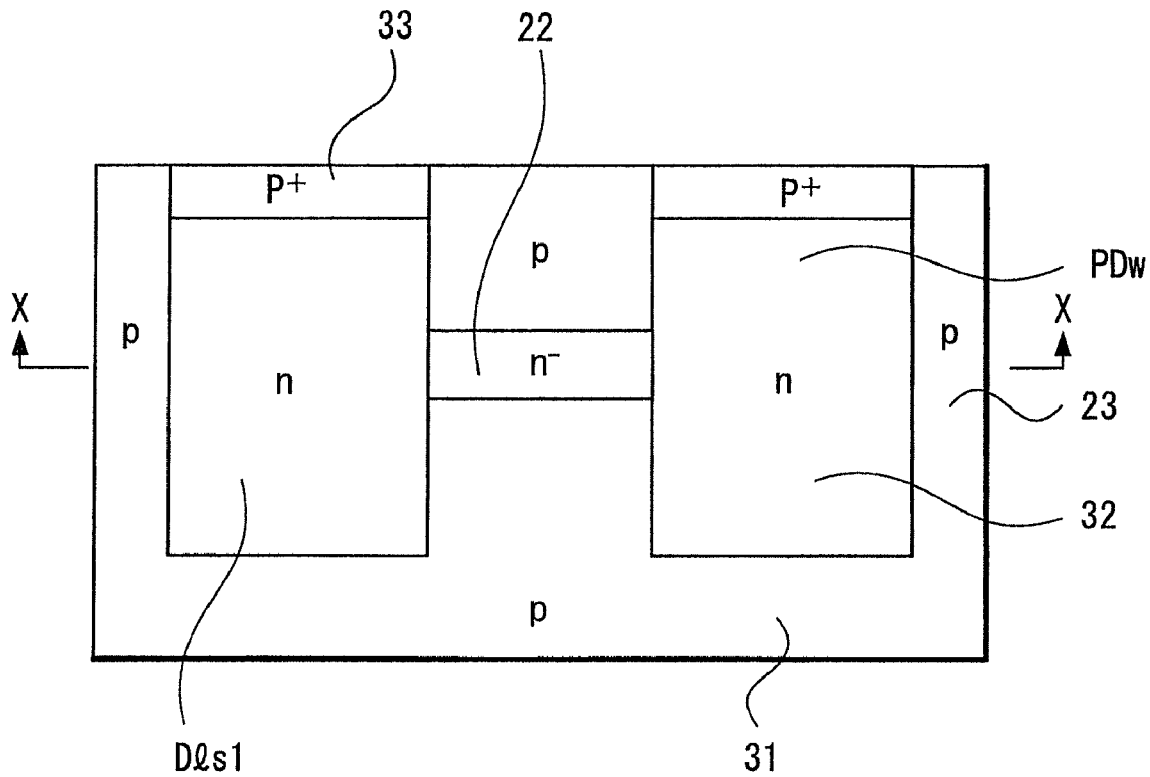
FIG. 8A is a cross-sectional view of the white photodiode, light-shielded diode, and overflow path included in one unit adapted to the solid-state imaging device according to the first embodiment of the present invention.
Figure 8B:
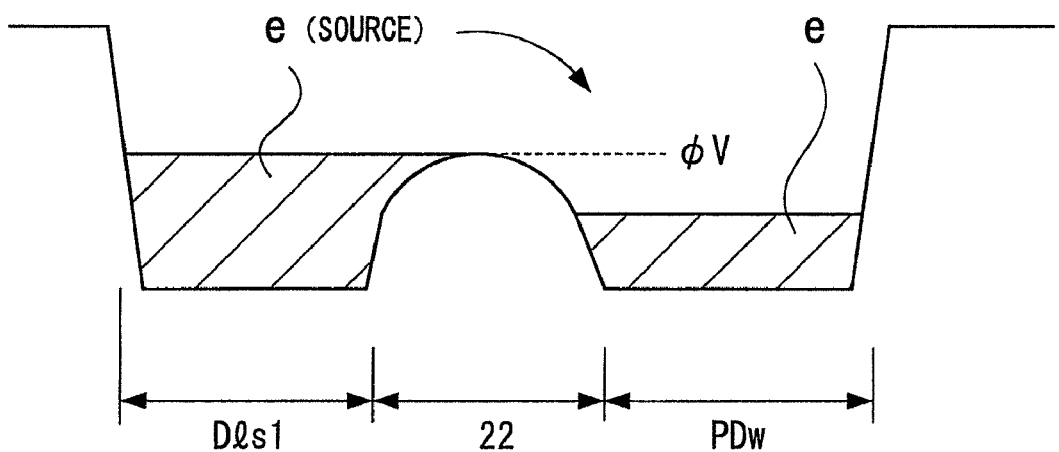
FIG. 8B is a potential diagram illustrating the operation of the structure schematically shown in a cross-sectional view taken along the line x-x of FIG. 8A.

In the next place, the operation of the solid-state imaging device according to the first embodiment of the present invention will be described. When the light is rendered incident to the white photodiode PDw, signal charges are accumulated in the white photodiode PDw. If the white photodiode PDw is saturated rapidly, further signal charges enter into the neighboring light-shielded diodes Dls (Dls1, Dls2), as shown in FIGS. 8A and 8B, by way of the overflow path 22 over the overflow barrier $\phi v$, and subsequently accumulated in the light-shielded diodes. Therefore, the saturation charges of the white pixels 2w amounts to the sum of the amount of the accumulation in the three diodes such as the white photodiode PDw having the incident light and the neighboring two light-shielded diodes Dls1 and Dls2. On the other hand, for each of the color photodiodes PDr, PDg, and PDb, the accumulation of signal charges can be carried out up to individual saturation amounts of signal charges.

Figure 6A:
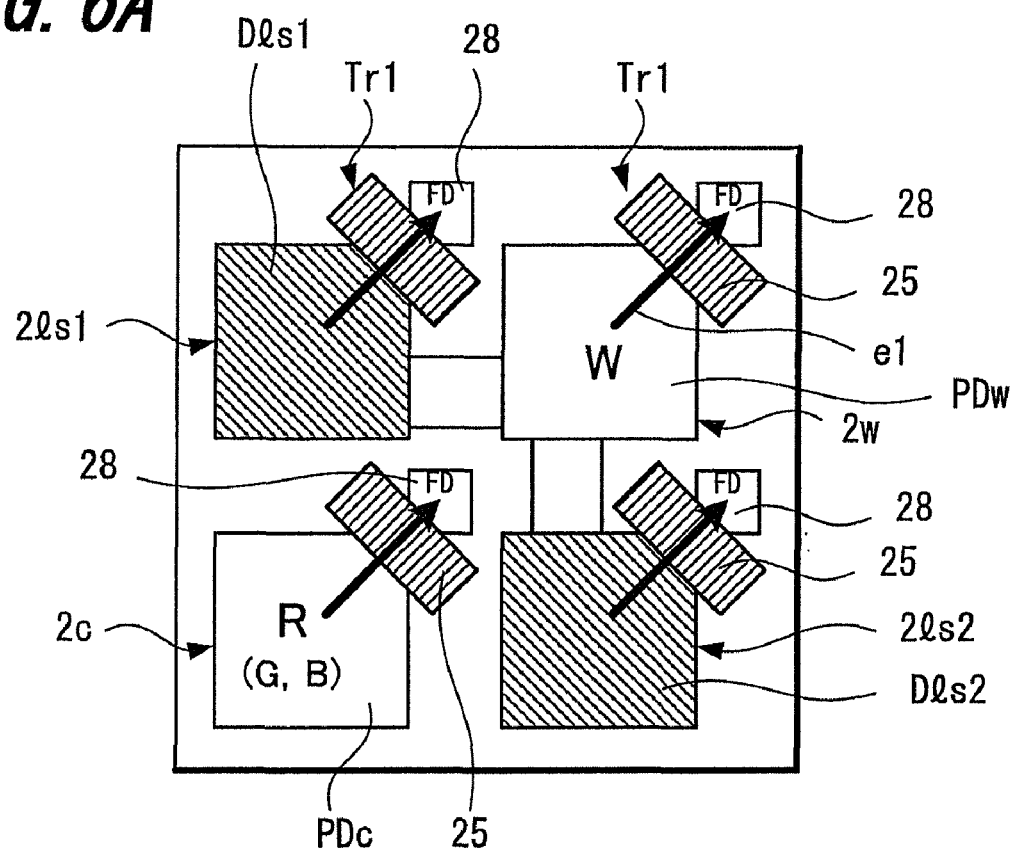
FIG. 6A is a schematic view illustrating the electronic structure of pixels included in one unit adapted to the solid-state imaging device according to the first embodiment of the present invention.
Figure 6B:
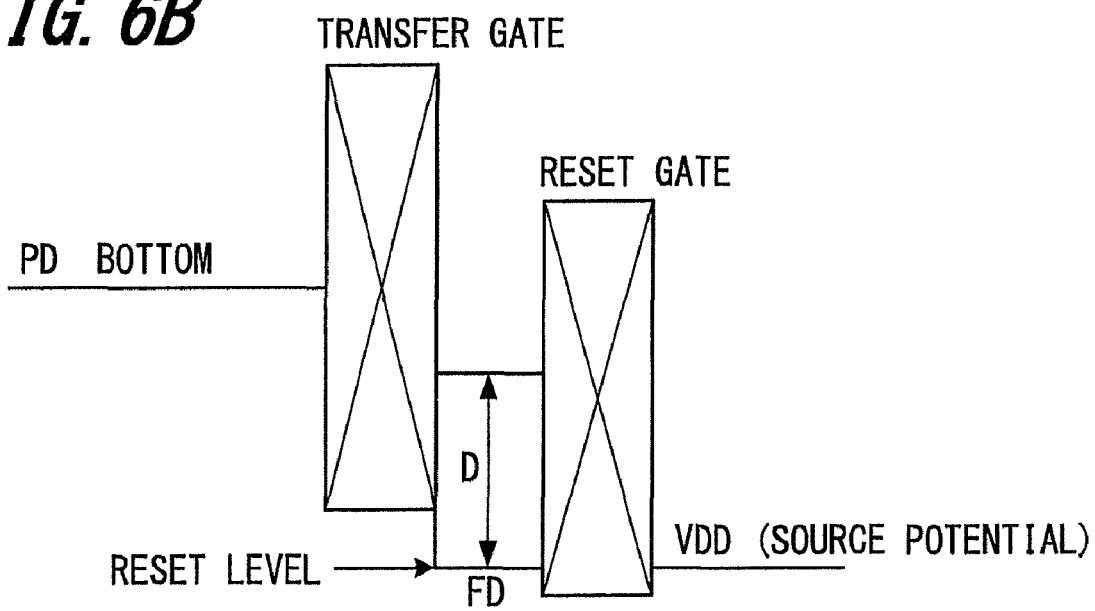
FIG. 6B is a potential diagram illustrating the saturation charges and output signal range of the structure of FIG. 6A.

With the solid-state imaging device according to the first embodiment, since the saturation charges of the white pixels 2w amounts to the sum of the three diodes such as the one white photodiode PDw and the two neighboring light-shielded diodes Dls1 and Dls2, the output signal ranges of red, green, and blue color pixels 2r, 2g, and 2b are not decreased even when the signal charges of the white pixel 2w is saturated rapidly. That is, the photodiodes PDr, PDg, and PDb of the color pixels 2r, 2g, and 2b can be utilized each to the individual nominal amount of the saturation charges. As shown in the schematic diagrams of FIGS. 6A and 6B, the signal charges from the white pixel 2w as well as from the light-shielded pixel 2ls are readout to each of the floating diffusion (FD) 28 in three separate steps through respective transfer transistors Tr1. Therefore, since the sizes of the photodiodes PDc and PDw and the diodes PDls1 and PDls2 are the same as mentioned earlier, the diodes can be fabricated with the same design. In addition, since the amount of saturation charges of the photodiode is the same for the white pixel 2w and each of the color pixels 2c (2r, 2g, 2b), the output signal range D also becomes the same (see FIG. 6B).

Figure 7A:
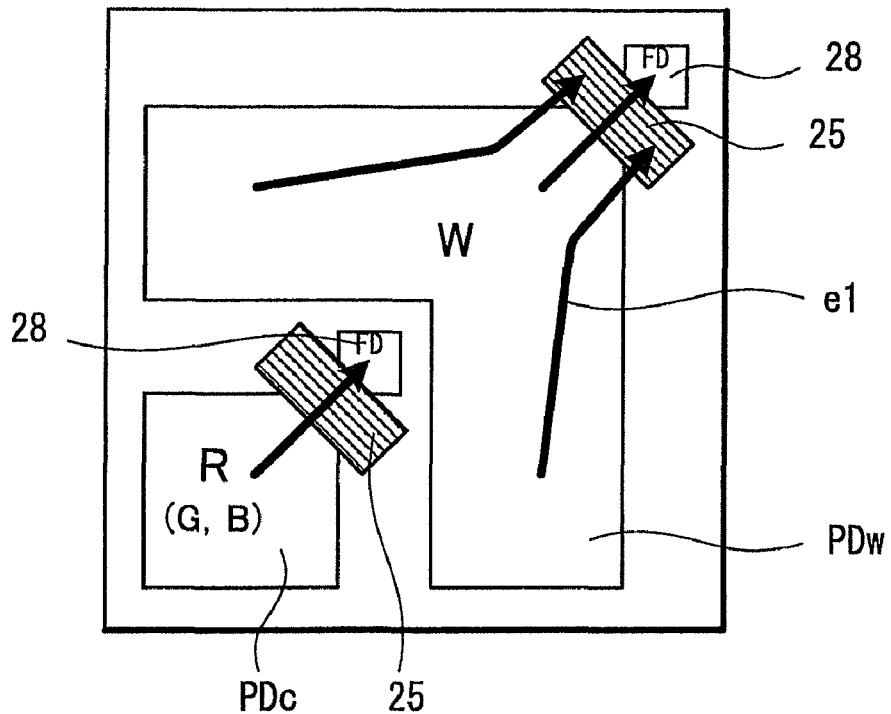
FIG. 7A is a schematic view illustrating the electronic structure of pixels included in one unit, prepared for purposes of comparison.
Figure 7B:
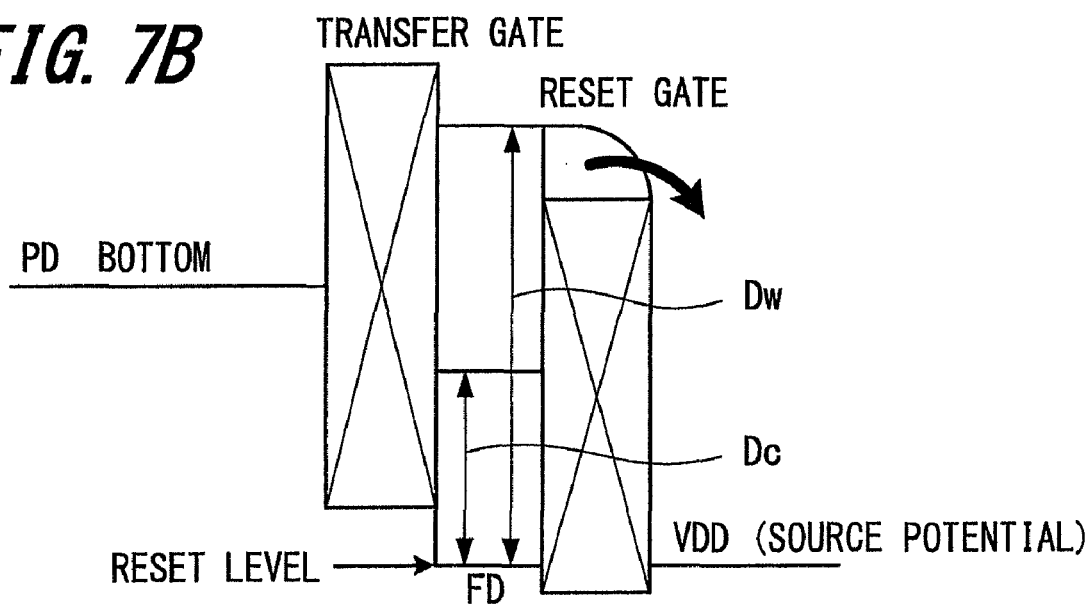
FIG. 7B is a potential diagram illustrating the saturation charges and output signal range of the structure of FIG. 7A.

Incidentally, a further tentative structure shown in FIGS. 7A and 7B is examined, in which a white photodiode PDw is formed by combining light-shielded diodes and a white photodiode, and one unit is formed by grouping the white photodiode PDw and a color photodiode PDc. In this structure, since the size differs greatly from each other between the photodiodes PDc and PDw, it is necessary to carry out individual optimization for proper operation. That is, in order to readout electric charges e1 placed in the region distant from the transfer gate electrode 25 in the white photodiode PDw (see FIG. 7A), a potential gradient has to be generated so that the potential becomes deeper toward the channel region under the transfer gate electrode. In addition, with this structure, since a range Dw of white signals is larger compared with a range Dc of color signals as shown in FIG. 7B, it follows that the signal charges from the white photodiode overflow at the floating diffusion (FD) unless the charge-voltage conversion rate is decreased. If the charge-voltage conversion rate is decreased, the device becomes more susceptible to circuit noises at low illumination levels. In contrast to the tentative structure described above, it is noted that the inconveniences mentioned just above do not take place with the device structure according to the aforementioned embodiment of the present invention.

In addition, the photodiode PDw for the white pixel 2w, and the photodiodes PDr, PDg, and PDb for the red, green, and blue color pixels 2r, 2g, and 2b are not placed adjacent to each other, and the light-shielded diodes Dls are formed in between. As a result, the electrical color mixing from one photodiode to another among the red, green, and blue color pixels 2r, 2g, and 2b and the optical color mixing caused by light diffraction and/or reflection under light shielding wirings can be improved. In addition, the leak of signal charges from the white pixel 2w into the color pixel 2c (2r, 2g, 2b) is suppressed. Namely, the capability of color separation can be improved.

As described above, with the solid-state imaging device according to the present embodiment, it becomes feasible, while seeking the improvement of the sensitivity by including the white pixel 2w, to properly deal with the strong incident light and to improve the output signal range of each of the color pixels 2r, 2g, and 2b. That is, the luminosity signal sensitivity can be improved without sacrificing the dynamic range of color signals. In addition, by providing the light-shielded diode Dls, the color mixing can be suppressed and color reproducibility can be improved.

In an embodiment of the present invention, the area of a light shielding region increases and the area of an opening spatially corresponding to a photodiode for light reception becomes relatively small compared with the area of an on-chip lens. Namely, this indicates that it tends to become hard to condense light. Particularly with a CMOS image sensor, since the distance is relatively large between the opening of metal wiring on the uppermost layer and the light receiving surface of a photodiode, the reduction of the metal wiring opening poses a risk of decreasing sensitivity. In such a case of the reduced opening and large distance to the surface of a photodiode, it is effective to provide an inner lens and/or a waveguide structure.

Figure 9:
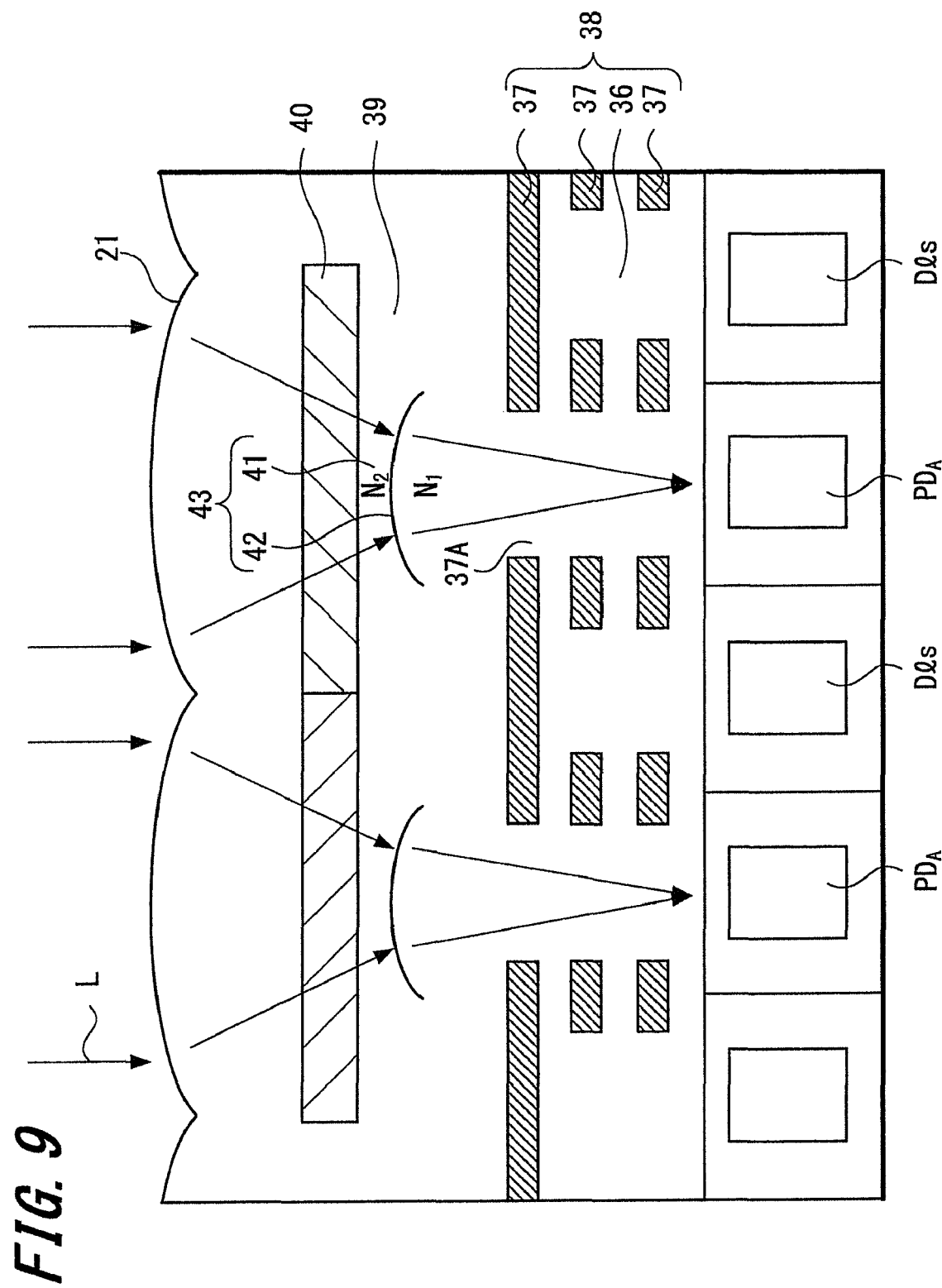
FIG. 9 is a schematic view illustrating the major portion of an imaging section according to a second embodiment of the present invention.

FIG. 9 is a schematic view illustrating another configuration adapted to the solid-state imaging device provided with an inner lens, according to a second embodiment of the present invention. The structure of the second embodiment shown in FIG. 9 has the pixel configuration similar to that of FIG. 4, in which the pixels configured to receive incident light such as the white pixel 2w and the color pixels 2c (2r, 2g, 2b) are representatively indicated by a single notation, a photodiode $PD_A$, and the light-shielded pixels 2ls are representatively indicated by another single notation, diode Dls. On top of the pixel previously formed, a multilevel wiring layer 38 is formed by including multiple layers of metal wirings 37 with interlayer insulator films 36 formed therebetween, and a color filter 40 and an on-chip lens 21 are formed on the structure with a planarization film 39 underlying between the multilevel wiring layer 38 and the color filter 40. The metal wiring 37 on the uppermost layer also serves as a light shielding film and the light-shielded diode Dls is shielded from light by the metal wiring 37 on the uppermost layer. The area 37A of the opening of the metal wiring 37 on the uppermost layer is formed relatively narrow compared with the on-chip lens 21.

In the present embodiment, an inner lens 43 is formed with insulator films having different refractive indices, for example, a silicon nitride film 41 and a silicon oxide film 42, in the region opposing to the photodiode $PD_A$ included in the pixel for receiving light, for example, between the multilevel wiring layer 38 and the color filter 40. As the inner lens 43, either a convex or concave lens may suitably be used. Since other structural features are similar to those mentioned earlier according to the first embodiment, the repeated description thereof is omitted herewith.

With the solid-state imaging device according to the second embodiment, by forming the inner lens 43, even in the case of the relatively narrow opening 37A, the condensing efficiency to the photodiode $PD_A$ is improved and the decrease in the sensitivity can be prevented. In addition, since it has the pixel structure similar to the first embodiment, the effects similar to those described earlier with the structure of the first embodiment can also be offered with the present structure, such as improving the luminosity signal sensitivity without sacrificing the dynamic range of color signals, suppressing the color mixing and thereby improving color reproducibility, etc.

Figure 10:
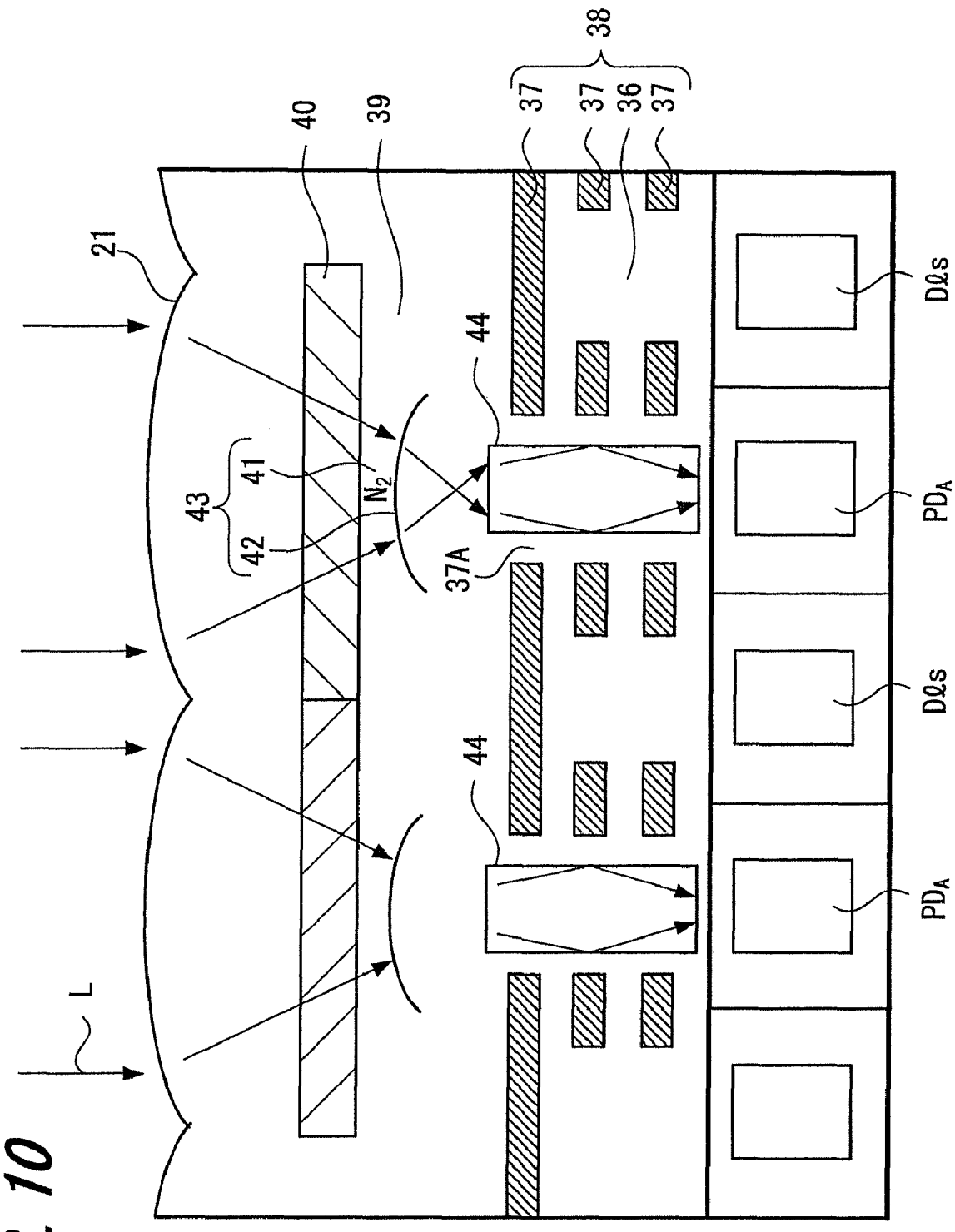
FIG. 10 is a schematic view illustrating the major portion of an imaging section according to a third embodiment of the present invention.

FIG. 10 is a schematic view illustrating a configuration adapted to the solid-state imaging device provided with a waveguide structure, according to a third embodiment of the present invention. In the present example, the waveguide structure is provided with an inner lens. The structure of the third embodiment shown in FIG. 10 has the pixel configuration similar to that of FIG. 4, in which the pixels for receiving incident light such as the white pixel 2w and the color pixels 2c (2r, 2g, 2b) are represented by a single notation, i.e., a photodiode $PD_A$, and the light-shielded pixels 2ls are represented by another single notation, diode Dls. In a manner similar to that described above in reference to FIG. 9, a multilevel wiring layer 38 is formed, on top of the pixel previously formed, by including multiple metal wirings 37 with interlayer insulator films 36 formed therebetween, and a color filter 40 and an on-chip lens 21 are formed on the structure with a planarization film 39 underlying between the multilevel wiring layer 38 and the color filter 40. The metal wiring 37 on the uppermost layer also serves as a light shielding film and the light-shielded diode Dls is shielded from light by the metal wiring 37 on the uppermost layer. The area 37A of the opening of the metal wiring 37 on the uppermost layer is formed relatively narrow compared with the on-chip lens 21.

Figure 11:
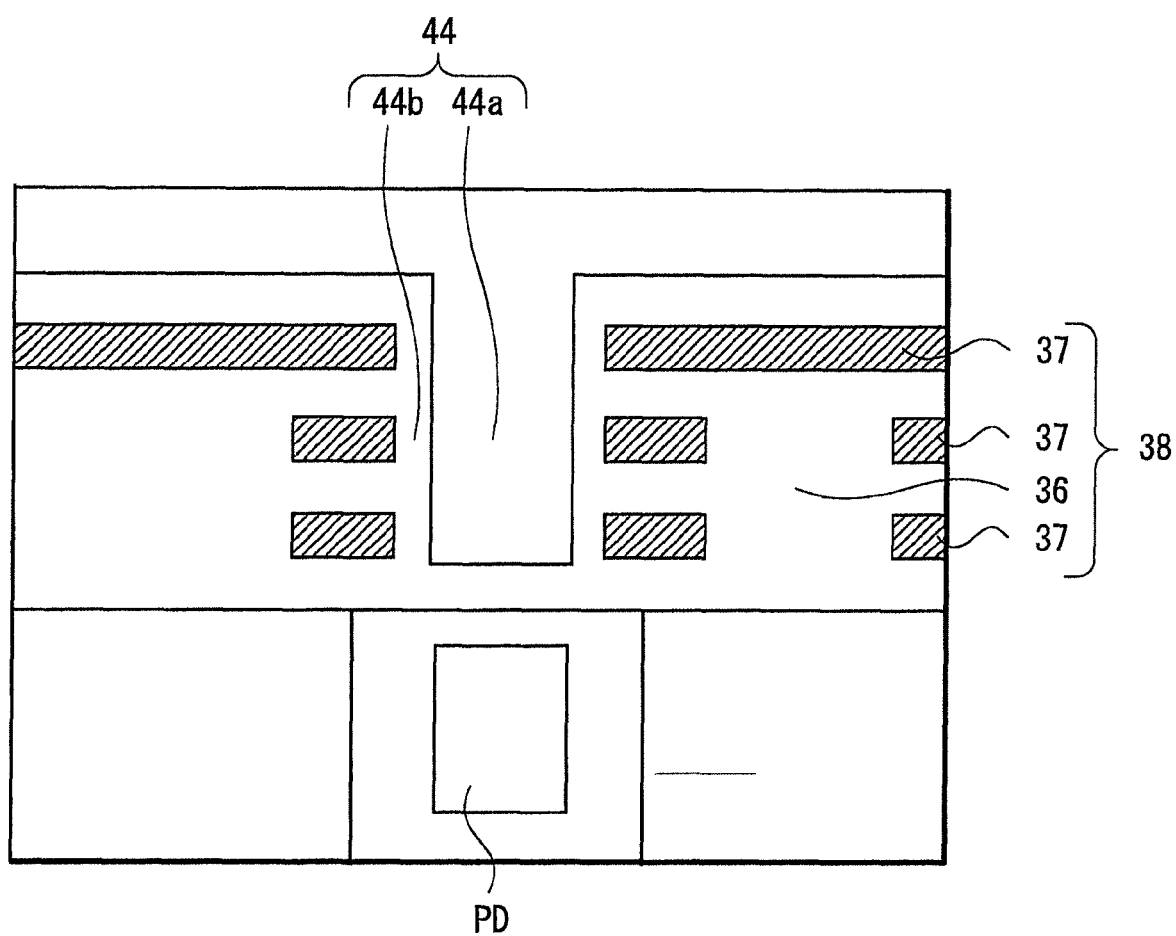
FIG. 11 is a schematic view illustrating the major portion of the imaging section including an exemplary waveguide structure according to the third embodiment of the present invention.
Figure 12:
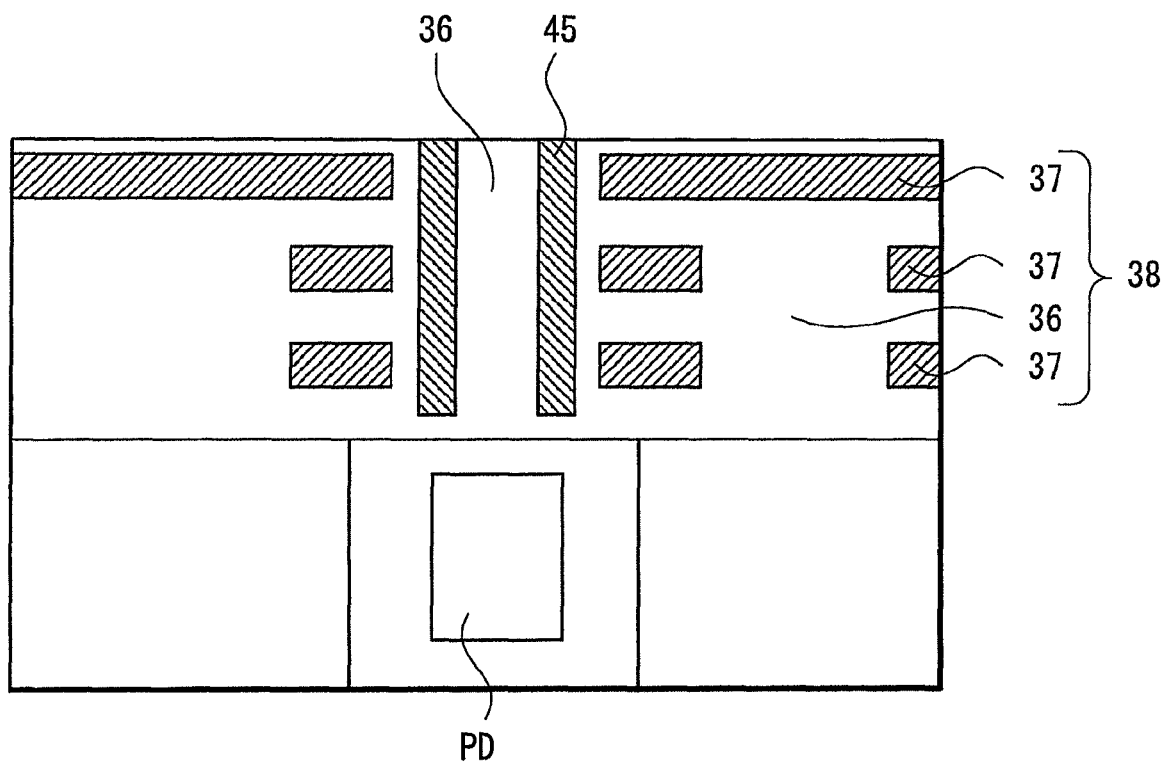
FIG. 12 is a schematic view illustrating the major portion of the imaging section including another exemplary waveguide structure according to the third embodiment of the present invention.

In the present embodiment, the waveguide structure 44 is formed in the region opposing to the photodiode $PD_A$ included in the pixel for receiving light, i.e., in the opening region formed in the multilevel wiring layer 38. As illustrated in FIG. 11, for example, the waveguide structure 44 can be fabricated by forming a core part 44a and a clad part 44b with insulated films having refractive indices different from each other. Alternatively, the waveguide structure can be fabricated as shown in FIG. 12 by forming a reflective metal film 45 on the side wall of the opening region in the multilevel wiring layer 38. In addition, the inner lens 43 is formed, in the region opposing to the photodiode $PD_A$ between the multilevel wiring layer 38 and the color filter 40, with insulator films that yield refractive indices different from each other, for example, a silicon nitride film 41 and a silicon oxide film 42. As the inner lens 43, either a convex or concave lens may suitably be used. Since other structural features are similar to those mentioned earlier according to the first embodiment, the repeated description thereof is omitted herewith. Incidentally, the configuration with only the waveguide structure 44 may be alternatively possible, omitting the inner lens 43.

With the solid-state imaging device according to the third embodiment, by forming the waveguide structure 44, even in the case of the relatively narrow opening 37A, the condensing efficiency to the photodiode $PD_A$ can be improved and the decrease in the sensitivity can be prevented. In addition, since it has the pixel structure similar to the first embodiment, the effects similar to those described earlier with the structure of the first embodiment can also be offered with the present structure such as improving the luminosity signal sensitivity without sacrificing the dynamic range of color signals, suppressing the color mixing and thereby improving color reproducibility, etc.

Figure 13:
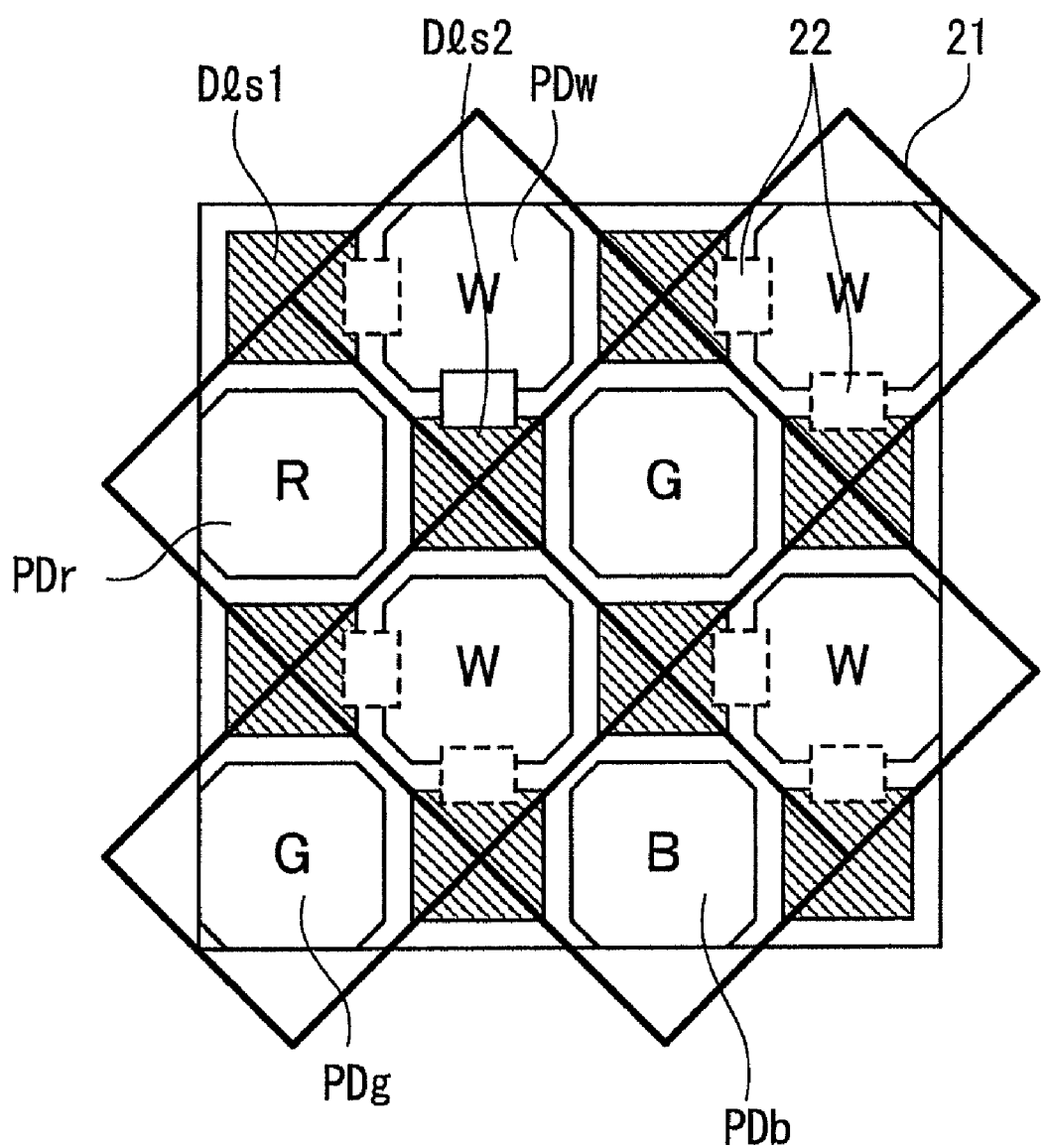
FIG. 13 is a schematic view illustrating the major portion of an imaging section according to a fourth embodiment of the present invention.

FIG. 13 is a schematic view illustrating a solid-state imaging device according to a fourth embodiment of the present invention. In the present embodiment, the area of the diode Dls included in the light-shielded pixel 2ls is formed smaller than that of at least one of the other photodiodes such as the ones included in the white pixel 2w and color pixels 2r, 2g, and 2b. In this example, it is formed smaller than the area of the photodiodes of the white pixel and color pixels, i.e., PDw and PDc (PDr, PDg, PDb). Since other structural features of the solid-state imaging device are similar to those described earlier according to the first embodiment with reference to FIG. 4, the portions corresponding to those in FIG. 4 are shown with identical representations and the repeated description thereof is herein omitted.

In the first embodiment mentioned earlier, the photodiodes and diodes of all pixels are described assuming the square arrangement. However, the amount of saturation charges for diodes Dls (Dls1, Dls2) of the light-shielded pixels is not necessarily needed to be the same as other photodiodes PDw and PDc in the white pixel and color pixels. For example, in the case where the output from the white pixel comes within approximately twice the output from the green pixel owning to spectral characteristics, the amount of saturation signals can be balanced between the white and green pixels by reducing the area of the diode Dls of the light-shielded pixel.

With the solid-state imaging device according to the fourth embodiment, therefore, depending on spectral characteristics, the amount of saturation signals can be balanced between the white pixels and other pixels such as red, green, and blue pixels, by reducing the area of the diode Dls of the light-shielded pixel to be smaller than the areas of other photodiodes PDw and PDc in the white pixel and color pixels. The areas of the photodiodes PDw and PDc for pixels with an opening such as the ones for the white pixel and color pixels can be increased by reducing the area of the diode Dls of the light-shielded pixel, and this also results in such a contribution as the improvement of light condensing characteristics. In the region vacated by the abovementioned area reduction of the diode Dls for light-shielded pixel, pixel constituent elements other than the photodiode can be disposed. For example, these elements may be pixel transistors in the case of a CMOS image sensor, or vertical transfer registers in the case of a CCD image sensor. In addition, the effects similar to those described earlier with the structure of the first embodiment can also be offered with the present structure such as improving the luminosity signal sensitivity without sacrificing the dynamic range of color signals, suppressing the color mixing and thereby improving color reproducibility, etc.

Into the structure of the fourth embodiment, the aforementioned inner lens and waveguide structure shown in FIGS. 9 and 10 respectively may also be incorporated.

Figure 14:
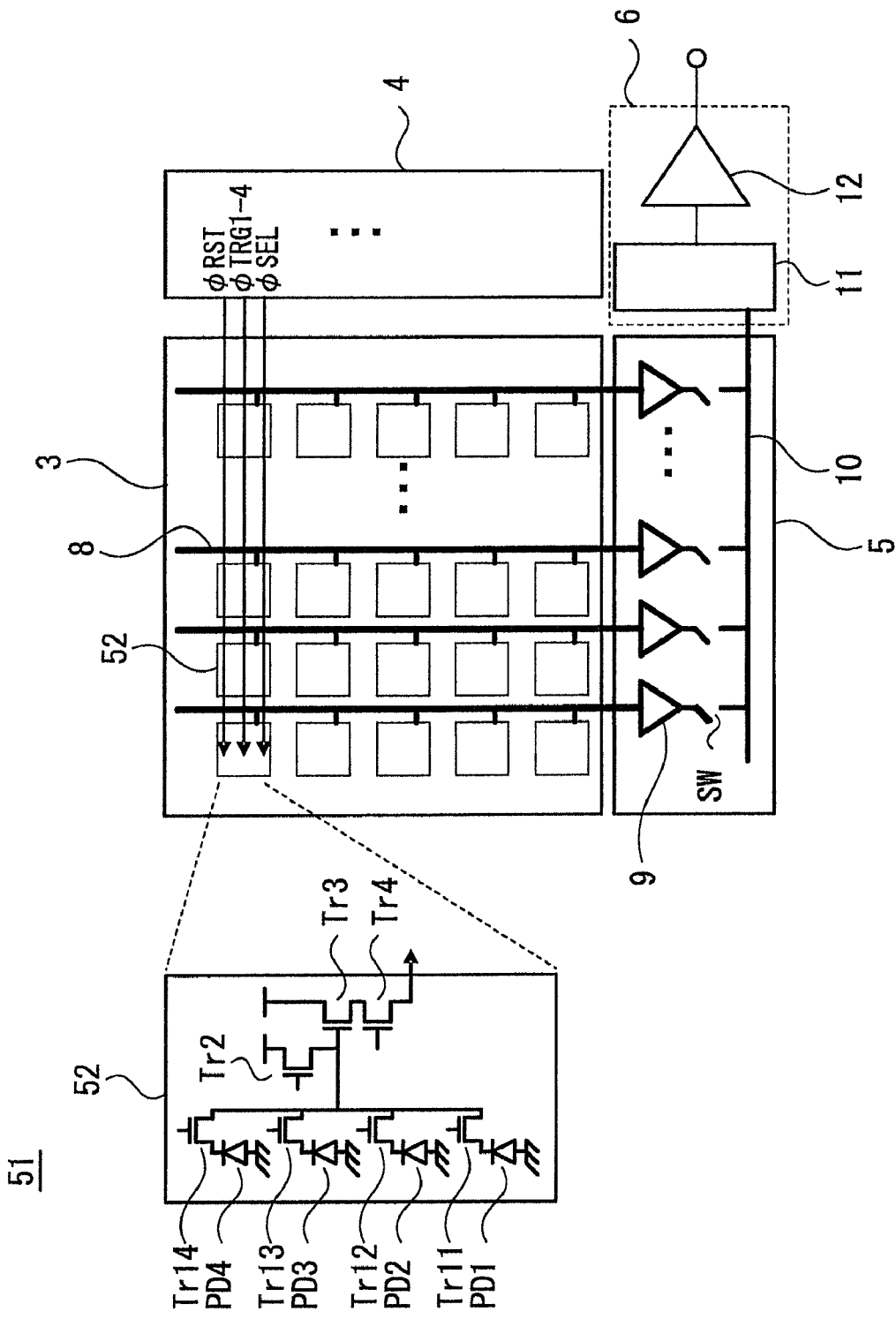
FIG. 14 is a drawing generally illustrating another configuration adapted to a solid-state imaging device according to an embodiment of the present invention.

FIG. 14 is a drawing generally illustrating a configuration adapted to a solid-state imaging device or CMOS image sensor according to another embodiment of the present invention. The solid-state imaging device of the present embodiment is provided by arranging a plurality of sets in which pixel transistors other than the transfer transistor are shared by a plurality of pixels each provided with photodiodes as photoelectric conversion elements, in this example, four pixels provided with four photodiodes (the set being hereinafter referred to as a sharing pixel).

The solid-state imaging device 51 according to the present embodiment includes an imaging section 3 (so-called pixel section) in which a plurality of sharing pixels 52 are arranged in a two-dimensional array, and peripheral circuits disposed around the imaging section 3, such as a vertical driving unit 4, a horizontal transfer unit 5, and an output unit 6. Each of the sharing pixels 52 includes a plurality of photodiodes PD serving as photoelectric conversion elements, i.e., four photodiodes PD in this example, four transfer transistors, one reset transistor, one amplifying transistor, and one selection transistor.

In the circuit configuration of the sharing pixel 52, as shown in FIG. 14, these four photodiodes PD (PD1, PD2, PD3, PD4) are connected with the sources of corresponding four transfer transistors Tr11, Tr12, Tr13, and Tr14, respectively, and the drains of the four transfer transistors Tr11, Tr12, Tr13, and Tr14 are connected with the source of the one reset transistor Tr2. A common floating diffusion region (FD) serving as a charge-voltage conversion means formed between respective transfer transistors Tr11, Tr12, Tr13, and Tr14 and the reset transistor Tr2 is connected with the gate of the one amplifying transistor Tr3. The source of the amplifying transistor Tr3 is connected with the drain of the one selection transistor Tr4. The drains of the reset transistor Tr2 and amplifying transistor Tr3 are both connected with a source voltage supply unit. In addition, the source of the selection transistor Tr4 is connected with a vertical signal line 8.

To the gates of the transfer transistors Tr11, Tr12, Tr13, and Tr14, row transfer signals ΦTRG1, ΦTRG2, ΦTRG3, and ΦTRG4 are applied, respectively; a row reset signal ΦRST is applied to the gate of the reset transistor Tr2; and a row selection signal ΦSEL is applied to the gate of the selection transistor Tr4.

Since the configuration of the vertical driving unit 4, horizontal transfer unit 5, output unit 6 and the like are similar to those described earlier referring to FIG. 3, the repeated description thereof is omitted herewith.

Figure 15A:
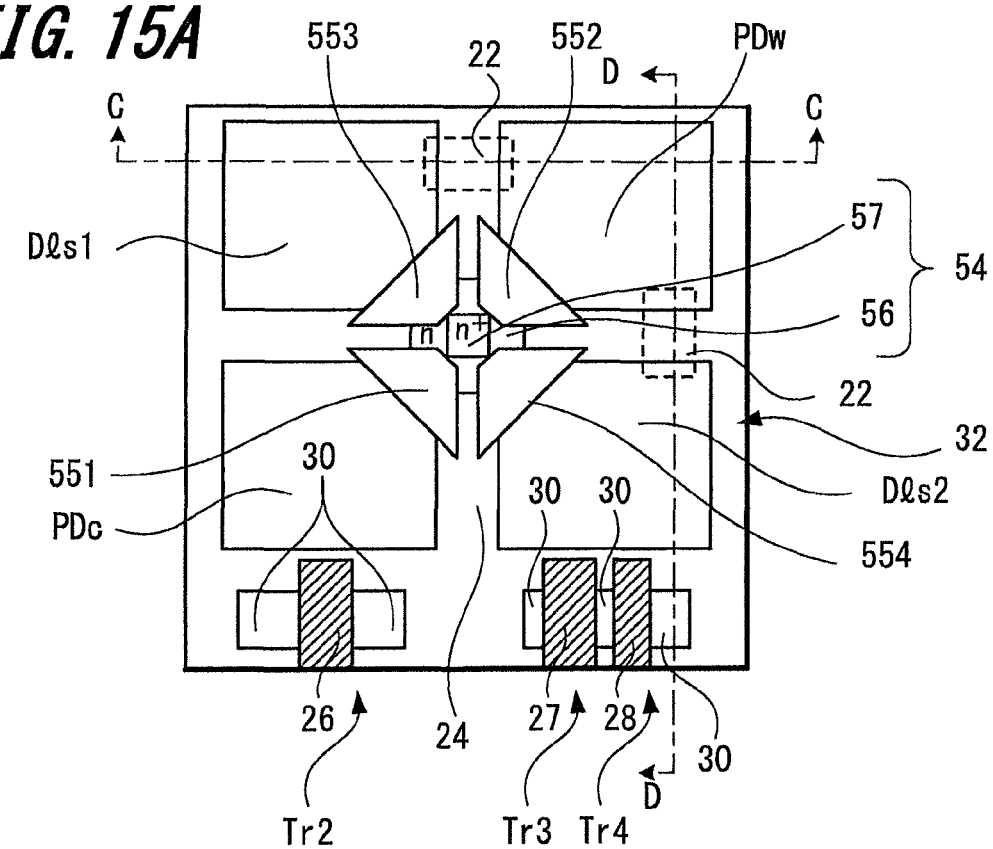
FIG. 15A is a schematic view illustrating the structure of pixels included in one unit adapted to the solid-state imaging device according to the fifth embodiment of the present invention.
Figure 15B:
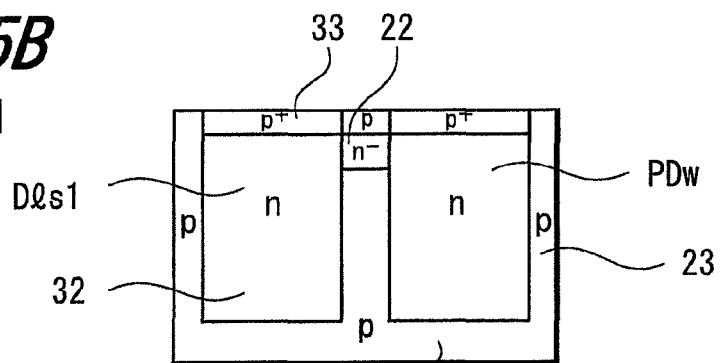
FIG. 15B is a cross-sectional view taken along the line C-C of FIG. 15A.
Figure 15C:
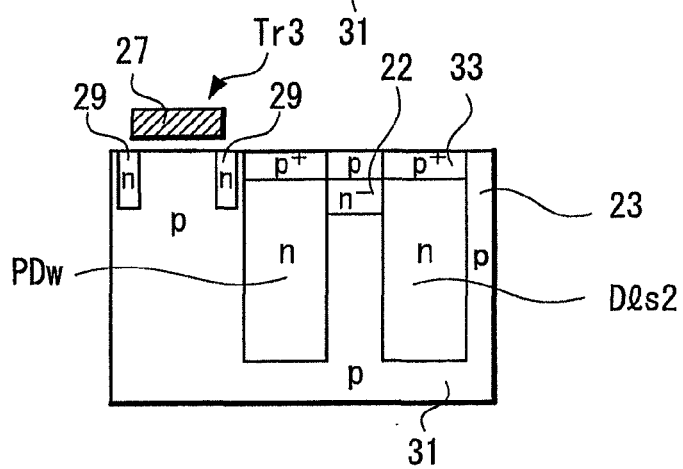
FIG. 15C is a cross-sectional view taken along the line D-D of FIG. 15A.

In addition, FIGS. 15A, 15B, and 15C are schematic views illustrating the planar configuration of the sharing pixel 52 according to a fifth embodiment of the invention. One set of the sharing pixel 52 according to the present embodiment includes two pixels each vertically and horizontally, four pixels in total. This one set as the sharing pixel 52 corresponds to the aforementioned unit of FIGS. 4, 5A, 5B, and 5C, and the sharing pixel includes one color photodiode PDc out of red, green, and blue color photodiodes, one white photodiode PDw, and two light-shielded diodes Dls (Dls1, Dls2).

In this embodiment, as shown in FIG. 15A, a common floating diffusion region (FD) 54 is disposed at the center of the structure so as to be shared. The photodiodes PDw, PDc and diodes Dls1, Dls2 are disposed in the two-by-two arrangement, i.e., two of them horizontally and two vertically, so as to hold the common floating diffusion region (FD) 54 in the middle of the structure. Each transfer gate electrode 55 (551, 552, 553, 554) is formed in the corner portion of each photodiode. The floating diffusion region (FD) 54 at the center is formed in the planar shape of a cross having a high concentration region 56 (n+ region in this example) at its center and low concentration regions 57 (n region in this example) each on the arm portions of the cross. To be connected in common with these four diodes PDw, PDc, PDls1, and PDls2; disposed herein are the reset transistor Tr2 having n-type source/drain regions 30 and 30, and the reset gate electrode 26; the amplifying transistor Tr3 having n-type source/drain regions 30 and 30, and the amplifying gate electrode 27; and the selection transistor Tr4 having n-type source/drain regions 30 and 30, and the selection gate electrode 28.

As shown in FIG. 15B (cross-sectional view taken along the line C-C of FIG. 15A) and FIG. 15C (cross-sectional view taken along the line D-D of FIG. 15A), each of the photodiodes PD is formed in a manner similar to FIGS. 5B and 5C by providing, in a semiconductor well region 31 having a first conductivity type i.e., p-type in the present example, a semiconductor region 32 as a charge accumulation region having a second conductivity type opposite to that of the first conductivity type (i.e., n-type); and by further providing, on the surface side of the n-type semiconductor region 32, a p-type semiconductor region 33 as a charge accumulation layer. The device isolation region 23 is formed with a p-type semiconductor region.

An overflow path 22 for connecting between the white photodiode PDw and the light-shielded diode Dls (Dls1 or Dls2) is formed in the device isolation region 23 with a p– or n– region, i.e., n-region in this example. The overflow path 22, which is situated either under the region where no pixel transistor Tr is formed on the surface side thereof, or in the region which does not cross the pixel transistor, can be formed in a relatively shallow region as shown in FIGS. 15B and 15C.

As shown in FIGS. 15A, 15B, and 15*c*, the photodiodes PD, PDc, PDw, and diodes Dls (Dls1, Dls2) are each formed with semiconductor regions having the same area and the same impurity concentration. Namely, each diode is formed to have the same amount of saturation charges. However, as described earlier with reference to FIG. 13, the area of the diode Dls may be alternatively formed to be smaller than that of other photodiodes PDw and PDc.

With the solid-state imaging device according to the fifth embodiment also, the effects similar to those described earlier with the structure of the first embodiment can be offered such as improving the luminosity signal sensitivity without sacrificing the dynamic range of color signals, suppressing the color mixing and thereby improving color reproducibility, etc.

In addition, in the fifth embodiment, since the transfer gate electrode 55 (551 through 554) is formed in the shape like a triangle (inclusive of a trapezoid) having a convex top portion facing the floating diffusion FD region 54, the area for disposing the photodiode can be secured. As a result, even when the pixel size is miniaturized, light incidence is not hindered by the transfer gate electrode during light condensation and the amount of saturation charges can be fully secured. Since the channel width of the transfer gate is formed to be wider on the side of the floating diffusion region (FD) 54 than on the side of the photodiode PD, cutoff characteristics and charge transfer characteristics of the transfer transistor can be made compatible. That is, this change in the channel width leads to the change in the potential of the channel and the electrical field is generated so that the potential becomes deeper from the side of the photodiode PD toward the floating diffusion region (FD) 54. As a result, the transfer of signal charges is improved. In addition, leak current is hard to be generated when the transfer transistor Tr1 is turned off.

The reason for this leak current suppression will be described as follows. In the case where the channel width W is constant throughout, the amount of channel potential change is the same on both sides of the photodiode PD and the floating diffusion region (FD) 54. As a result, when a potential difference is generated so as to apply an electric field in the channel region for defining the transfer direction with the transfer gate being turned on, this causes that much amount of potential difference even when the transfer gate is off. By contrast, with the transfer gate of the present embodiment, since the potential change is large on the side of floating diffusion (FD), the potential difference can be made small with the transfer gate turned off, supposing the channel potential difference between the sides of the photodiode PD and the floating diffusion (FD) 54 is the same as above with the transfer gate turned on. That is, the degree of channel closure on the side of floating diffusion (FD) is strengthened when the transfer gate is turned off, and the leak current is reduced as a result.

In the next place, a solid-state imaging device according to a sixth embodiment of the resent invention is described herein below. In the aforementioned embodiments, it is not necessary to readout signal charges in the light-shielded pixel under the conditions of setting the illumination and/or shutter such that signal charges do not leak out to the light-shielded pixel.

Therefore, the solid-state imaging device according to the sixth embodiment of the invention is configured so that signal charges in the light-shielded pixel are not readout when the illumination and/or shutter are set for the signal charges not to leak out to light-shielded pixel.

According to the sixth embodiment, the amount of data to be readout can be reduced by half. Thus, if a frame rate is maintained, the circuit drive frequency can be reduced by half, namely, power consumption can be suppressed. In addition, if the circuit drive frequency is maintained, picture images can be output at a double rate. Thus, the effects similar to those described earlier with the structure of the first embodiment can also be offered with the present structure such as improving the luminosity signal sensitivity without sacrificing the dynamic range of color signals, suppressing the color mixing and thereby improving color reproducibility, etc.

Figure 16A:
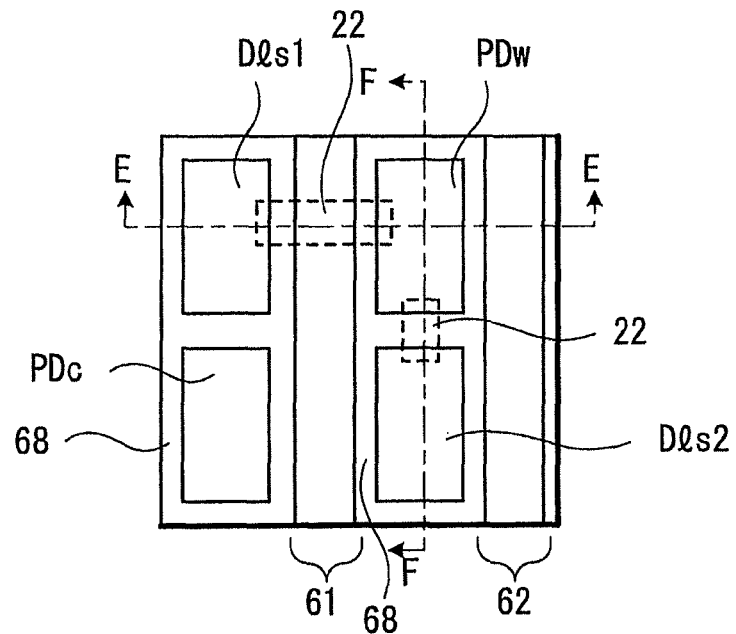
FIG. 16A is a schematic view illustrating the structure of pixels included in one unit according to the seventh embodiment of the present invention.
Figure 16B:
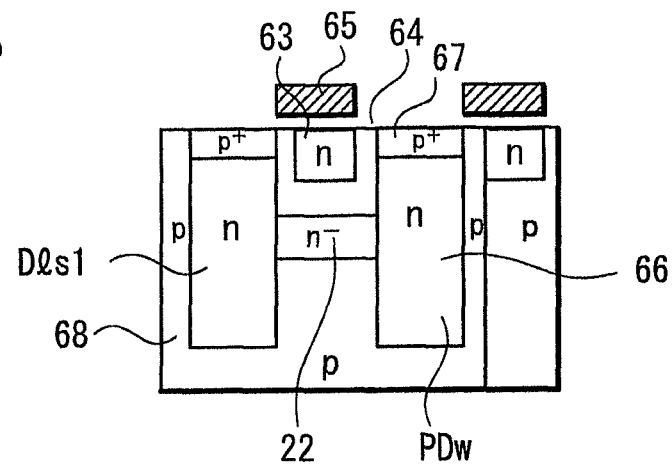
FIG. 16B is a cross-sectional view taken along the line C-C of FIG. 16A.
Figure 16C:
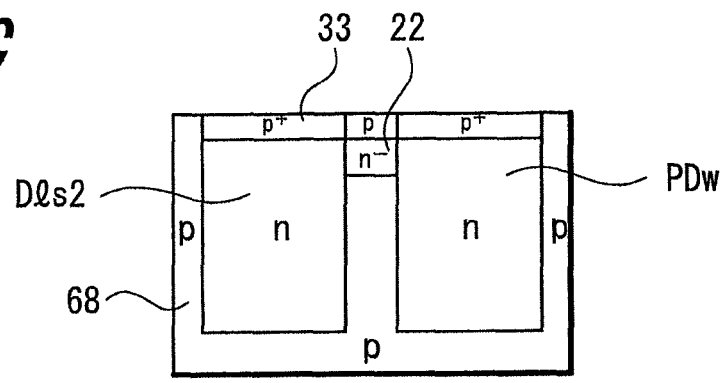
FIG. 16C is a cross-sectional view taken along the line D-D of FIG. 16A.

The solid-state imaging device of the present embodiment may also be adapted to CCD image sensors. FIGS. 16A, 16B, and 16C are schematic views illustrating the solid-state imaging device adapted to a CCD image sensor according to a seventh embodiment of the invention. FIGS. 16A, 16B, and 16C schematically illustrate the structure of pixels, particularly of one unit in an imaging section.

Although not shown in a drawing herein, the CCD image sensor according to the present embodiment is provided, as generally known, by including a plurality of pixels arranged two-dimensionally, a vertical shift register of CCD structure configured to readout signal charges in each pixel row and to transfer the signal charges in the vertical direction, a horizontal shift register of CCD structure configured to receive the signal charges transferred from each of the vertical shift registers and transfer the signal charges in the horizontal direction, and an output unit.

Referring to FIG. 16A, in the present embodiment, one unit is formed by including two pixels each vertically and horizontally, four pixels in total. Namely, the light-shielded diode Dls1 and the color photodiode PDc (PDr, PDg, PDb) are repeatedly disposed in a first column, and the white photodiode PDw and the light-shielded diode Dls2 are repeatedly disposed in a second column. In a manner similar to FIG. 4, four diodes as the one unit are arranged so that the color photodiode PDc and the white photodiode Pdw are disposed along one diagonal, and two light-shielded diodes Dls1 and Dls2 are disposed along the other diagonal.

With regard to the color photodiode PDc, the red photodiode PDr, green photodiode PDg, and blue photodiode PDb are repeatedly disposed in the vertical direction, and the Bayer arrangement of color photodiodes is formed when viewed the imaging section in its entirety. Corresponding to the diode sequence in the first column, a vertical transfer register 61 for the first column is formed, for example, with an n-type transfer channel 63, a gate insulation film 64, and a transfer electrode 65 (see FIG. 16B); and corresponding to the diode sequence in the second column, another vertical transfer register 62 for the second column is similarly formed with the transfer channel 63, gate insulation film 64, and transfer electrode 65.

Each of the photodiodes PD is formed by including, for example, an n-type semiconductor region 66 that becomes a charge accumulation region, and a p+ accumulation region 67 on the surface of the semiconductor region 66. Although the details are omitted herein, the unit pixels each including the photodiode PD and vertical transfer register are divided from each other by channel stop regions formed of a p+ region and p-type semiconductor well regions.

The electric charges of the light-shielded diode Dls1 and color photodiode PDc are readout to the vertical transfer register 61 in the first column, while the charges of the white photodiode PDw and light-shielded diode Dls2 are readout to the vertical transfer register 62 in the second column.

Among the four diodes for forming the unit, disposed in the two by two arrangement, the light-shielded diode Dls1 in the first column and the white photodiode PDw in the second column are connected by way of an overflow path 22, and the white photodiode PDw and the light-shielded diode Dls2 in the second column are connected by way of another overflow path 22. The overflow path 22 stretching over the vertical transfer register 61 is formed in relatively deep location as shown in FIG. 16B (cross-sectional view taken along the line E-E of FIG. 16A), while the other overflow path 22 which does not stretch over the vertical transfer registers 61 and 62 is formed in a relatively shallow location as shown in FIG. 16C (along the line F-F of FIG. 16A). Since other features of the overflow paths 22 and structures of an on-chip lens, a color filter, etc. are similar to those described earlier with reference to FIG. 4, the repeated description thereof is herein omitted.

In addition, for the CCD image sensor according to the present embodiment, it is also possible to suitably incorporate some of the aforementioned features, such as the configuration of making the area of the light-shielded diode Dls smaller than other photodiodes, the inner lens, the waveguide structure, etc.

Also with the CCD imaging sensor according to the seventh embodiment, since the pixel structure similar to that of the first embodiment is adapted, the similar effects can be offered, such as improving the luminosity signal sensitivity without sacrificing the dynamic range of color signals, suppressing the color mixing and thereby improving color reproducibility, etc.

Although the examples of the color pixel structure including red, green, and blue primary color filters have been described in the aforementioned embodiments, the structure is not limited to those examples, and the color pixel structure may include cyan, magenta, and yellow complementary color filters.

Figure 17:
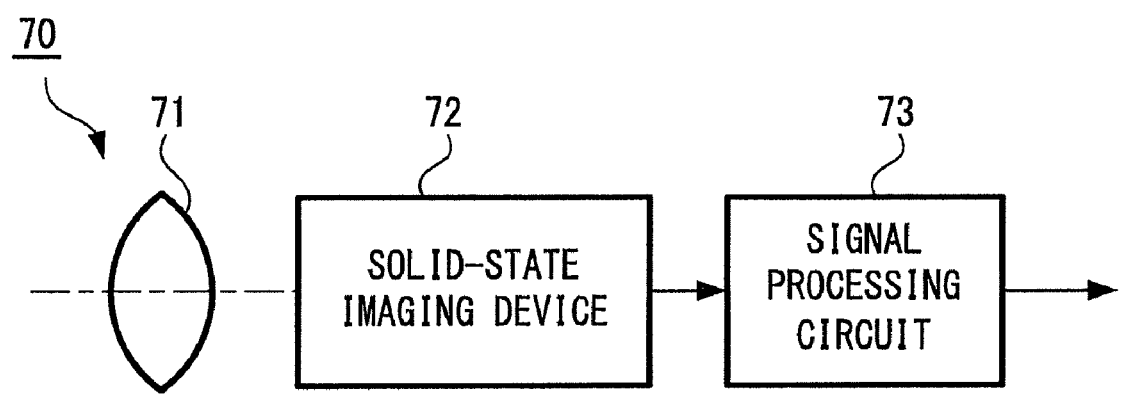
FIG. 17 is a simplified schematic diagram illustrating the configuration of a camera according to an embodiment of the present invention.

FIG. 17 is a simplified schematic diagram illustrating the configuration of a camera provided with the abovementioned CMOS or CCD solid-state imaging device or according to an embodiment of the invention. Referring to FIG. 17, a camera 70 according to the present embodiment is provided by including an optical system (optical lens) 71, a solid-state imaging device 72, and a signal processing circuit 73. As the solid-state imaging device 72 to be included in the camera, any one of the solid-state imaging devices with the pixel structures described in the aforementioned embodiments, and preferably the structure detailed in either the first or fourth embodiment, may be adapted. The camera according to the present embodiment may also be provided with a further embodiment with a camera module which is formed by modularizing the optical system (optical lens) 71, the solid-state imaging device 72, and the signal processing circuit 73. The optical system 71 images the light image (incident light) on the imaging surface of the solid-state imaging device 72. Thereby, the signal charges are accumulated for a fixed period of time in the photoelectric conversion element of the solid-state imaging device 72. The signal processing circuit 73 provides a variety of signal processing to output signals from the solid-state imaging device 72, and outputs the processed signals subsequently.

With the camera of the present embodiment, high sensitivity and high power picture images can be obtained since the camera is provided with the solid-state imaging device according to an embodiment of the present invention.

According to an embodiment of the present invention, it is also feasible to provide various electronic devices such as, for example, mobile devices which include the abovementioned camera of FIG. 17 or the camera module.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
    an imaging section including a group of elements, the group of elements including color photoelectric conversion elements configured to convert light signals in first, second, and third wavelength ranges to electric signals, respectively, a white photoelectric conversion element configured to convert light signals in a wavelength range including an entire visible light range and a portion of an infrared light range to electric signals, and a light-shielded diode element configured to be shielded from light; and a peripheral circuit disposed around the imaging section, wherein in the imaging section, a unit is formed by including a white photoelectric conversion element and a light-shielded diode element for one color photoelectric conversion element, and within the unit, the white photoelectric conversion element is electrically connected with the light-shielded diode element by way of an overflow path.

2. The solid-state imaging device according to claim 1, wherein the unit is formed by including two elements each vertically and horizontally, four elements in total, a first one being the white photoelectric conversion element, a second one being the one color photoelectric conversion element, and a third one being the light-shielded diode element, and a fourth one being another light-shielded diode element, and within the unit, the white photoelectric conversion element is disposed diagonally to the one color photoelectric conversion element, and the two light-shielded diode elements are each electrically connected with the white photoelectric conversion element by way of overflow paths.

3. The solid-state imaging device according to claim 2, wherein a group of the color photoelectric conversion elements are disposed to form a Bayer arrangement.

4. The solid-state imaging device according to claim 3, wherein the imaging section further includes on-chip lenses each spatially corresponding to the one color photoelectric conversion element and the white photoelectric conversion element and disposed to form a slant pixel arrangement.

5. The solid-state imaging device according to claim 4, wherein the imaging section further includes an inner lens to serve as a light condensing structure.

6. The solid-state imaging device according to claim 4, wherein the imaging section further includes an optical waveguide to serve as a light condensing structure.

7. The solid-state imaging device according to claim 4, wherein an area of the light-shielded diode element is smaller than an area of at least one of the photoelectric conversion elements and the white photoelectric conversion element.

8. The solid-state imaging device according to claim 4, wherein in the imaging section, a floating diffusion region, an amplifying transistor, and a reset transistor are disposed so as to be shared by a plurality of the elements.

9. The solid-state imaging device according to claim 1, wherein the unit includes one white photoelectric conversion element and two light-shielded diode elements.

10. The solid-state imaging device according to claim 1, wherein a group of the color photoelectric conversion elements are disposed to form a Bayer arrangement.

11. The solid-state imaging device according to claim 1, wherein the imaging section further includes on-chip lenses each spatially corresponding to the one color photoelectric conversion element and the white photoelectric conversion element and disposed to form a slant pixel arrangement.

12. The solid-state imaging device according to claim 1, wherein the imaging section further includes an inner lens to serve as a light condensing structure.

13. The solid-state imaging device according to claim 1, wherein the imaging section further includes an optical waveguide to serve as a light condensing structure.

14. The solid-state imaging device according to claim 1, wherein an area of the light-shielded diode element is smaller than an area of at least one of the color photoelectric conversion elements and the white photoelectric conversion element.

15. The solid-state imaging device according to claim 1, wherein the first wavelength range is a wavelength range of a blue color filter, the second wavelength range is a wavelength range of a green color filter, and the third wavelength range is a wavelength range of a red color filter.

16. The solid-state imaging device according to claim 1, wherein the first wavelength range is a wavelength range of a cyan color filter, the second wavelength range is a wavelength range of a magenta color filter, and the third wavelength range is a wavelength range of a yellow color filter.

17. A camera, comprising:
a solid-state imaging device;
an optical system configured to lead incident light to a photoelectric conversion element included in the solid-state imaging device; and
a signal processing circuit configured to process output signals from the solid-state imaging device;
wherein the solid-state imaging device includes a group of elements, the group of photoelectric conversion elements including color photoelectric conversion elements configured to convert light signals in first, second, and third wavelength ranges to electric signals, respectively, a white photoelectric conversion element configured to convert light signals in a wavelength range including an entire visible light range and a portion of an infrared light range to electric signals, and a light-shielded diode element configured to be shielded from light, and
wherein a unit is formed by including a white photoelectric conversion element and a light-shielded diode element for one color photoelectric conversion element, and within the unit, the white photoelectric conversion element is electrically connected with the light-shielded diode element by way of an overflow path.

18. The camera according to claim 17, wherein
the unit is formed by including two elements each vertically and horizontally, four elements in total, a first one being the white photoelectric conversion element, a second one being the one color photoelectric conversion element, and a third one being the light-shielded diode element, and a fourth one being another light-shielded diode element, and within the unit, the white photoelectric conversion element is disposed diagonally to the one color photoelectric conversion element, and the two light-shielded diode elements are each electrically connected with the white photoelectric conversion element by way of overflow paths.

19. The camera according to claim 18, wherein
a group of the color photoelectric conversion elements are disposed to form a Bayer arrangement.

20. The camera according to claim 19, wherein
the solid-state imaging device further includes on-chip lenses each spatially corresponding to the one color photoelectric conversion element and the white photoelectric conversion element and disposed to form a slant pixel arrangement.

* * * * *